US008733038B2

(12) United States Patent
Kalkanoglu et al.

(10) Patent No.: US 8,733,038 B2
(45) Date of Patent: May 27, 2014

(54) ROOFING AND SIDING PRODUCTS HAVING RECEPTOR ZONES AND PHOTOVOLTAIC ROOFING AND SIDING ELEMENTS AND SYSTEMS USING THEM

(71) Applicant: CertainTeed Corporation, Valley Forge, PA (US)

(72) Inventors: Husnu M. Kalkanoglu, Swarthmore, PA (US); Gregory F. Jacobs, Oreland, PA (US); Wayne E. Shaw, Glen Mills, PA (US); Peter Chihlas, Lansdale, PA (US)

(73) Assignee: CertainTeed Corporation, Valley Forge, PA (US)

( * ) Notice: Subject to any disclaimer, the term of this patent is extended or adjusted under 35 U.S.C. 154(b) by 0 days.

(21) Appl. No.: 13/910,148

(22) Filed: Jun. 5, 2013

(65) Prior Publication Data

US 2013/0269288 A1    Oct. 17, 2013

Related U.S. Application Data

(62) Division of application No. 12/351,653, filed on Jan. 9, 2009, now Pat. No. 8,458,967.

(60) Provisional application No. 61/020,376, filed on Jan. 10, 2008.

(51) Int. Cl.
*E04D 13/18* (2014.01)

(52) U.S. Cl.
USPC .................................. 52/173.3; 136/246

(58) Field of Classification Search
USPC ......... 52/173.3, 519, 522; 136/245, 246, 244, 136/251
See application file for complete search history.

(56) References Cited

U.S. PATENT DOCUMENTS

| | | | |
|---|---|---|---|
| 6,311,436 B1 * | 11/2001 | Mimura et al. | 52/173.3 |
| 6,453,629 B1 * | 9/2002 | Nakazima et al. | 52/173.3 |
| 6,606,830 B2 * | 8/2003 | Nagao et al. | 52/173.3 |
| 8,309,840 B2 * | 11/2012 | Stevens et al. | 136/251 |
| 8,505,249 B2 * | 8/2013 | Geary | 52/173.3 |
| 2008/0302030 A1 * | 12/2008 | Stancel et al. | 52/173.3 |

* cited by examiner

*Primary Examiner* — Jeanette E Chapman
*Assistant Examiner* — Daniel Kenny
(74) *Attorney, Agent, or Firm* — McDonnell Boehnen Hulbert & Berghoff LLP

(57) ABSTRACT

The present invention relates generally to roofing or siding products. The present invention relates more particularly to roofing or siding products for use with photovoltaic elements, and to photovoltaic systems that include one or more photovoltaic elements joined to a roofing or siding substrate. In one embodiment, a roofing product includes a rigid roofing or siding substrate having a top surface, the top surface having one or more receptor zones thereon, each receptor zone being adapted to receive one or more photovoltaic elements, each receptor zone having a different surfacing than the area of the top surface adjacent to it.

20 Claims, 14 Drawing Sheets

8,733,038 B2

ROOFING AND SIDING PRODUCTS HAVING RECEPTOR ZONES AND PHOTOVOLTAIC ROOFING AND SIDING ELEMENTS AND SYSTEMS USING THEM

CROSS-REFERENCE TO RELATED APPLICATIONS

This application is a divisional of U.S. patent application Ser. No. 12/351,653, filed Jan. 9, 2009, now U.S. Pat. No. 8,458,967, which claims priority under 35 U.S.C. §119(e) to U.S. Provisional Patent Application Ser. No. 61/020,376, filed Jan. 10, 2008, each of which is hereby incorporated herein by reference in its entirety.

BACKGROUND OF THE INVENTION

1. Field of the Invention

The present invention relates generally to roofing and siding products. The present invention relates more particularly to roofing and siding products for use with photovoltaic elements, and to photovoltaic systems that include one or more photovoltaic elements joined to a roofing or siding substrate.

2. Technical Background

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as device performance has improved. They can be used to provide at least a significant fraction of the electrical energy needed for a building's overall function; or they can be used to power one or more particular devices, such as exterior lighting systems.

Photovoltaic cells can be packaged as photovoltaic elements, in which one or more photovoltaic cells are electrically interconnected and provided in a common package. One common type of photovoltaic element is an encapsulated photovoltaic element, in which the photovoltaic cells are packaged together in between layers of layer material. The layer materials are often chosen to be highly light-transmissive, and to retain their transmissivity over time. Encapsulated photovoltaic elements can be convenient for integration with various substrates.

Roofing products in which a photovoltaic element is integrated with a roofing substrate (such as a shingle or tile) have been proposed. Such "photovoltaic roofing elements" (also known as "roofing-integrated photovoltaics" or "RIPV") can provide both protection from the elements and power generation capability in a single product. Moreover, photovoltaic roofing elements can provide aesthetic benefit, as they can be made to blend with the architecture of the overall roof much better than can conventional photovoltaic modules.

Encapsulated photovoltaic elements can be convenient for integration with various substrates. However, in many circumstances, formation of a long-lived physical connection between the material of the encapsulated photovoltaic element and the material of a substrate can be difficult, especially when the materials used to make the encapsulated photovoltaic element have low surface tension. Notably, the surfaces used as the top layer of many roofing substrates can be less than optimal for adhesion to a photovoltaic element.

One disadvantage to the use of photovoltaic roofing elements is that they can require special skills and tools for installation, making them challenging for installation by a roofing professional. Moreover, once installed on a roof, they can be relatively susceptible to damage. Accordingly, at any point after a roof has photovoltaic roofing elements installed thereon, it can be more difficult for workers to perform any other necessary tasks on the roof.

There remains a need for roofing products and photovoltaic roofing systems that can address these deficiencies.

SUMMARY OF THE INVENTION

One aspect of the present invention is a roofing or siding product including:
a rigid roofing or siding substrate having a top surface, the top surface having one or more receptor zones thereon, each receptor zone being adapted to receive one or more photovoltaic elements, each receptor zone having a different surfacing than the area of the top surface adjacent to it.

Another aspect of the present invention is a photovoltaic roofing or siding element including:
a rigid roofing or siding substrate having a top surface, the top surface having one or more receptor zones thereon, each receptor zone being adapted to receive one or more photovoltaic elements, each receptor zone having a different surfacing than the area of the top surface adjacent to it; and
one or more photovoltaic elements disposed in the one or more receptor zones of the top surface of the rigid roofing or siding substrate.

Another aspect of the present invention is a photovoltaic roofing system comprising one or more photovoltaic roofing elements as described above disposed on a roof deck.

Another aspect of the present invention is a photovoltaic siding system comprising one or more photovoltaic siding elements as described above disposed on a substantially vertical exterior surface of a building.

Another aspect of the present invention is a method for installing a photovoltaic roofing system, the method comprising:
installing on a roof deck a rigid roofing substrate having a top surface, the top surface having one or more receptor zones thereon, each receptor zone being adapted to receive one or more photovoltaic elements, each receptor zone having a different surfacing than the area of the top surface adjacent to it; then
disposing the one or more photovoltaic elements on the one or more receptor zones of the top surface of the rigid roofing substrate.

Another aspect of the present invention is a method for installing a photovoltaic siding system, the method comprising:
installing on a substantially vertical exterior surface of a building a rigid siding substrate having a top surface, the top surface having one or more receptor zones thereon, each receptor zone being adapted to receive one or more photovoltaic elements, each receptor zone having a different surfacing than the area of the top surface adjacent to it; then disposing the one or more photovoltaic elements on the one or more receptor zones of the top surface of the rigid siding substrate.

Another aspect of the present invention is a kit for the installation of a photovoltaic roofing or siding system, the kit comprising:

one or more rigid roofing or siding substrates each having a top surface, the top surface having one or more receptor zones thereon, each receptor zone being adapted to receive one or more photovoltaic elements, each receptor zone having a different surfacing than the area of the top surface adjacent to it; and one or more photovoltaic elements.

The products, elements, systems, methods and kits of the present invention can result in a number of advantages. For example, in some embodiments, the products and systems of the present invention can provide enhanced adhesion between the photovoltaic element and the roofing or siding substrate. In other examples, the methods of the present invention can be used to install a photovoltaic roofing or siding system so that the installation of the relatively rugged rigid roofing substrate can be performed by a roofing or siding professional, and the more fragile photovoltaic elements can be installed much later, by a person skilled in electrical interconnections. Other advantages will be apparent to the person of skill in the art.

The accompanying drawings are not necessarily to scale, and sizes of various elements can be distorted for clarity.

DETAILED DESCRIPTION OF THE INVENTION

Figure 1:
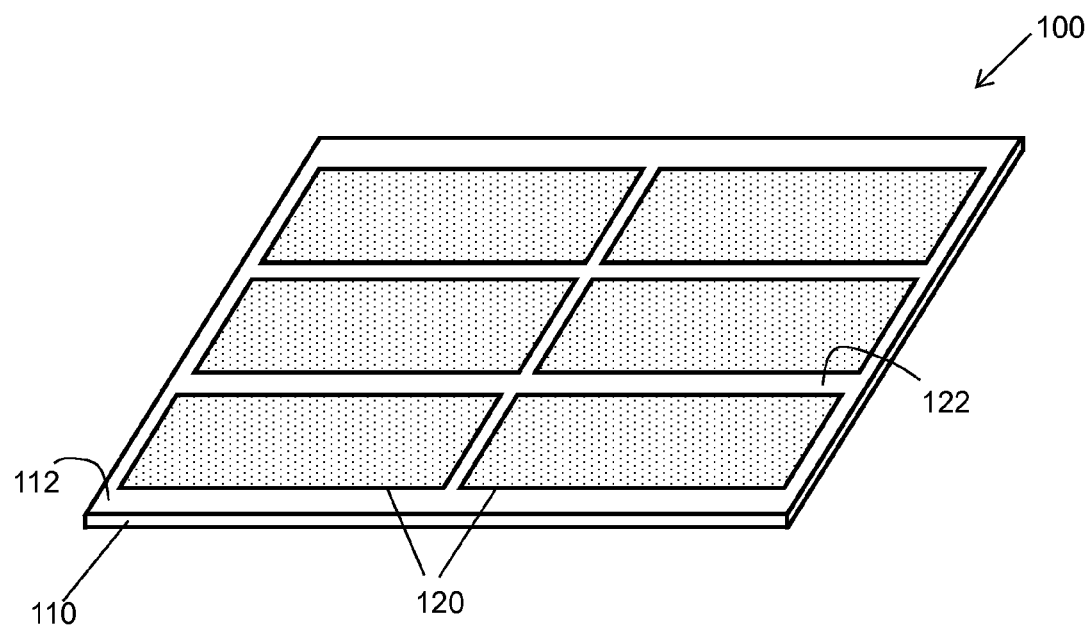
FIG. 1 is a schematic perspective view of a roofing or siding product according to one embodiment of the invention.

One embodiment of a roofing or siding product according to the present invention is shown in schematic perspective view in FIG. 1. Roofing or siding product 100 comprises a rigid roofing or siding substrate 110 having a top surface 112. One or more (in this embodiment, six) receptor zones 120 are on the top surface 112 of rigid roofing or siding substrate 110. Each receptor zone 120 is adapted to receive one or more photovoltaic elements, and has a different surfacing than the area 122 of the top surface adjacent to the receptor zone 120. The sizes and shapes of the one or more receptor zones can, for example, be selected based on the sizes and shapes of the photovoltaic elements envisioned for use therewith. For example, certain photovoltaic elements available from Uni-solar Ovonic have dimensions of about 12 cm×18 cm (T-Cells); about 24 cm×36 cm (L-Cells); or about 40 cm×5 m (strip).

In some embodiments, the receptor zone has dimensions that are somewhat larger than (e.g., in the range of 101-120% of, or even 101-110% of) the dimensions of the photovoltaic elements with which they are to be used. Such embodiments can be more user-friendly, as precise alignment is not necessary for an installer to accurately place the photovoltaic element completely within the receptor zone. In certain embodiments, when an elongated photovoltaic element is used, such as the strips available from Uni-solar Ovonic, minor angular misalignments can be tolerated.

Photovoltaic elements suitable for use in conjunction with the roofing and siding products of the invention, and in the photovoltaic roofing and siding elements, systems, methods and kits of the invention comprise one or more interconnected photovoltaic cells provided together in a single package. The photovoltaic cells of the photovoltaic elements can be based on any desirable photovoltaic material system, such as monocrystalline silicon; polycrystalline silicon; amorphous silicon; III-V materials such as indium gallium nitride; II-VI materials such as cadmium telluride; and more complex chalcogenides (group VI) and pnicogenides (group V) such as copper indium diselenide. For example, one type of suitable photovoltaic cell includes an n-type silicon layer (doped with an electron donor such as phosphorus) oriented toward incident solar radiation on top of a p-type silicon layer (doped with an electron acceptor, such as boron), sandwiched between a pair of electrically-conductive electrode layers. Another type of suitable photovoltaic cell is an indium phosphide-based thermo-photovoltaic cell, which has high energy conversion efficiency in the near-infrared region of the solar spectrum. Thin film photovoltaic materials and flexible photovoltaic materials can be used in the construction of photovoltaic elements for use in the present invention. In one embodiment of the invention, the photovoltaic element includes a monocrystalline silicon photovoltaic cell or a polycrystalline silicon photovoltaic cell. The photovoltaic elements for use in the present invention can be flexible, or alternatively can be rigid.

The photovoltaic elements can be encapsulated photovoltaic elements, in which photovoltaic cells are encapsulated between various layers of material. For example, an encapsulated photovoltaic element can include a top layer material at its top surface, and a bottom layer material at its bottom surface. The top layer material can, for example, provide environmental protection to the underlying photovoltaic cells, and any other underlying layers. Examples of suitable materials for the top layer material include fluoropolymers, for example ETFE ("TEFZEL"), PFE, FEP, PVF ("TEDLAR"), PCTFE or PVDF. The top layer material can alternatively be, for example, a glass sheet, or a non-fluorinated polymeric material. The bottom layer material can be, for example, a fluoropolymer, for example ETFE ("TEFZEL"), PFE, FEP, PVDF or PVF ("TEDLAR"). The bottom layer material can alternatively be, for example, a polymeric material (e.g., polyester such as PET); or a metallic material (e.g., steel or aluminum sheet).

Figure 2:
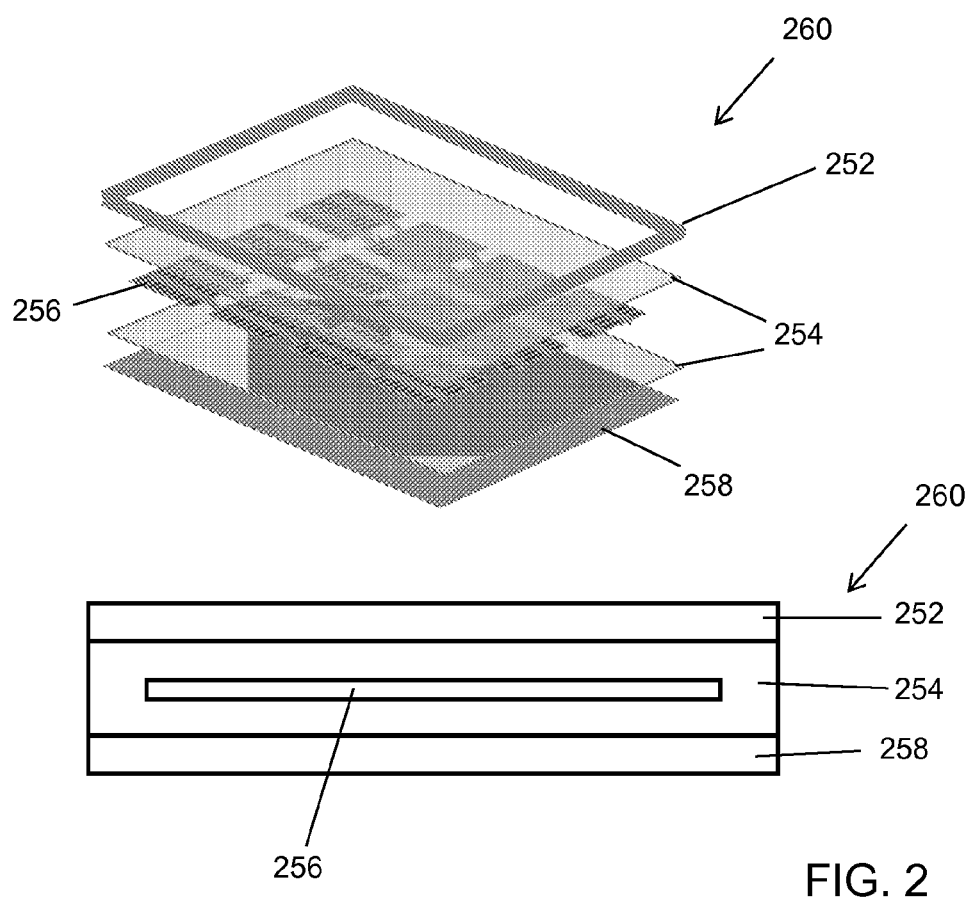
FIG. 2 is a schematic exploded view and a schematic cross-sectional view of an encapsulated photovoltaic element suitable for use in the present invention.

As the person of skill in the art will appreciate, an encapsulated photovoltaic element can include other layers interspersed between the top layer material and the bottom layer material. For example, an encapsulated photovoltaic element can include structural elements (e.g., a reinforcing layer of glass, metal or polymer fibers, or a rigid film); adhesive layers (e.g., EVA to adhere other layers together); mounting structures (e.g., clips, holes, or tabs); one or more electrical connectors (e.g., electrodes, electrical connectors; optionally connectorized electrical wires or cables) for electrically interconnecting the photovoltaic cell(s) of the encapsulated photovoltaic element with an electrical system. An example of an encapsulated photovoltaic element suitable for use in the present invention is shown in schematic exploded view and schematic cross sectional view in FIG. 2. Encapsulated photovoltaic element 260 includes a top protective layer 252 (e.g., glass or a fluoropolymer film such as ETFE, PVDF, PVF, FEP, PFA or PCTFE); encapsulant layers 254 (e.g., EVA, functionalized EVA, crosslinked EVA, silicone, thermoplastic polyurethane, maleic acid-modified polyolefin, ionomer, or ethylene/(meth)acrylic acid copolymer); a layer of electrically-interconnected photovoltaic cells 256; and a backing layer 258 (e.g., PVDF, PVF, PET).

A photovoltaic element having a self-adhesive layer on its bottom surface can be suitable for use in the present invention (e.g., it can be adhered in the receptor zone). In one example, the self-adhesive layer is a 3-10 mil thick layer of a butyl rubber-based or rubber resin pressure sensitive adhesive. Suitable rubber resin pressure sensitive adhesives are disclosed, for example, in U.S. Pat. No. 3,451,537, which is hereby incorporated herein by reference. In certain embodiments, the adhesive package on the bottom surface of the photovoltaic element has a composite structure comprising a layer of pressure sensitive adhesive and a layer of deformable material. The deformable material can allow for more economical usage of a higher performance, higher cost pressure sensitive adhesive. The use of deformable layers to improve contact between pressure sensitive adhesives and irregular surfaces is disclosed in U.S. Pat. No. 5,310,278, which is hereby incorporated herein by reference in its entirety. The self-adhesive layer can be protected with a releasable liner; the releasable liner can be removed (e.g., by peeling) to expose the adhesive for attachment to the receptor zone of a rigid roofing or siding substrate.

The photovoltaic element can include at least one antireflection coating, for example as the top layer material in an encapsulated photovoltaic element, or disposed between the top layer material and the photovoltaic cells.

Suitable photovoltaic elements can be obtained, for example, from China Electric Equipment Group of Nanjing, China, as well as from several domestic suppliers such as Uni-Solar Ovonic, Sharp, Shell Solar, BP Solar, USFC, First-Solar, General Electric, Schott Solar, Evergreen Solar and Global Solar. Moreover, the person of skill in the art can fabricate encapsulated photovoltaic elements using techniques such as lamination or autoclave processes. Encapsulated photovoltaic elements can be made, for example, using methods disclosed in U.S. Pat. No. 5,273,608, which is hereby incorporated herein by reference.

The top surface of photovoltaic element is the surface presenting the photoelectrically-active areas of its one or more photoelectric cells. When installed, the photovoltaic roofing or siding elements of the present invention should be oriented so that the top surface of the photovoltaic element is able to be illuminated by solar radiation. The bottom surface is the surface opposite the top surface.

The photovoltaic element also has an operating wavelength range. Solar radiation includes light of wavelengths spanning the near UV, the visible, and the near infrared spectra. As used herein, the term "solar radiation," when used without further elaboration means radiation in the wavelength range of 300 nm to 2500 nm, inclusive. Different photovoltaic elements have different power generation efficiencies with respect to different parts of the solar spectrum. Amorphous doped silicon is most efficient at visible wavelengths, and polycrystalline doped silicon and monocrystalline doped silicon are most efficient at near-infrared wavelengths. As used herein, the operating wavelength range of a photovoltaic element is the wavelength range over which the relative spectral response is at least 10% of the maximal spectral response. According to certain embodiments of the invention, the operating wavelength range of the photovoltaic element falls within the range of about 300 nm to about 2000 nm. In certain embodiments of the invention, the operating wavelength range of the photovoltaic element falls within the range of about 300 nm to about 1200 nm.

The present invention can be practiced using any of a number of types of roofing and siding substrates. In other embodiments of the invention, the top surface of the roofing substrate is metallic. In certain embodiments of the invention, the roofing substrate is formed from a polymeric material. Suitable polymers include, for example, polyolefin, polyethylene, polypropylene, ABS, PVC, polycarbonates, nylons, EPDM, fluoropolymers, silicone, rubbers, thermoplastic elastomers, polyesters, PBT, poly(meth)acrylates, epoxies, and can be filled or unfilled or formed. For example, in one embodiment of the invention the roofing or siding substrate has polypropylene at its top surface. In other embodiments of the invention, the roofing or siding substrate is formed from metal, for example aluminum or steel. The roofing or siding substrate can be made of other materials, such as composite, ceramic, or cementitious materials.

In another embodiment, the rigid roofing or siding substrate is a tile, shake or shingle. For example, the tile, shake or shingle can be formed from a polymeric material, which can be filled with fibers, glass mat, particulate matter, felt, or fabric, and coated with a variety of materials, such as protective or decorative coatings or films, solar reflective materials (e.g., in areas outside of the receptor zones). Tiles, shakes and shingles can be manufactured, for example, using conventional methods. Tiles, shakes and shingles can be provided in bundles to a worksite, and can be installed using mechanical fasteners or other suitable methods. Adjacent courses of tiles, shakes or shingles can be applied in an overlapping manner to cover and protect the roof. The tiles, shakes and shingles of the present invention can be installed together with conventional tiles, shakes and shingles, to provide only certain areas of the roof with photovoltaic power generation capability.

Figure 3:
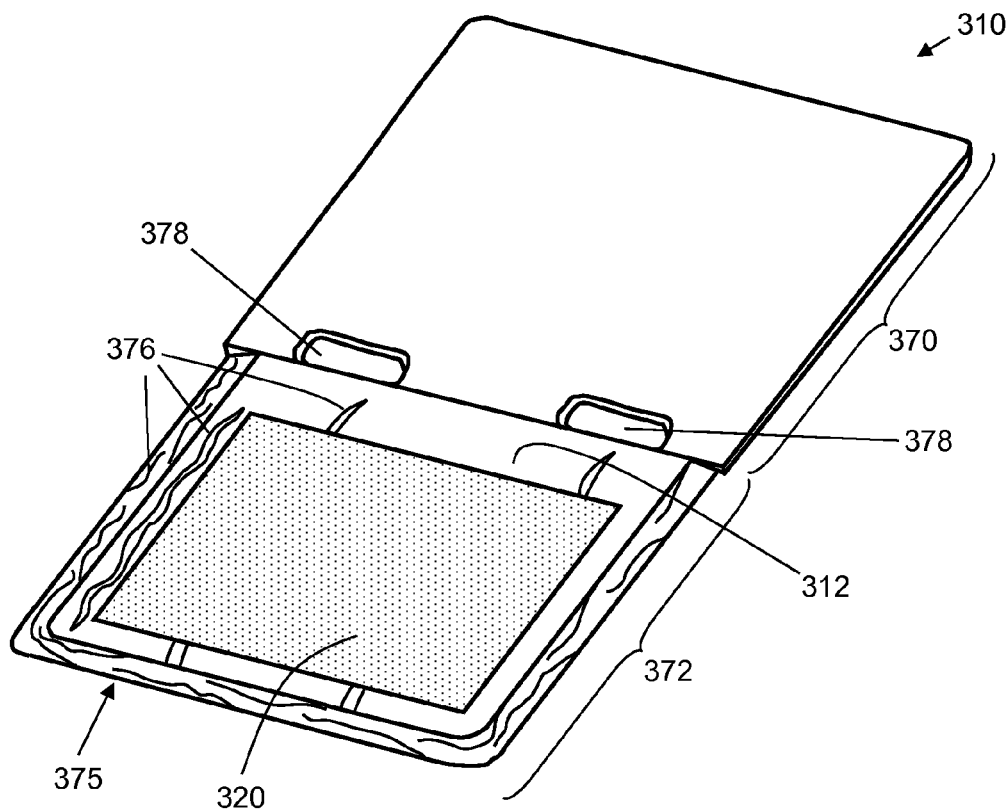
FIG. 3 is a top perspective schematic view of a roofing product according to one embodiment of the invention.

In one example, and as shown in top perspective schematic view in FIG. 3, the rigid roofing substrate is a polymeric roofing tile 310 having a headlap portion 370 and a butt portion 372. The top surface 312 of the polymeric roofing tile 310 has formed in its butt portion 372 on it a single receptor zone 320. In certain embodiments of the invention, and as shown in FIG. 3, the butt portion 372 of the polymeric roofing tile 310 has features 376 molded into its surface, in order to provide a desired appearance to the polymeric roofing tile. In the embodiment shown in FIG. 3, the polymeric roofing tile 310 has a pair of recessed nailing areas 378 formed in its headlap portion 370, for example as described in International Patent Application Publication no. WO 08/052029, which is hereby incorporated herein by reference in its entirety. The U-shaped periphery along the right and left sides and lower edge of the butt portion 372 slopes downwardly from its top surface to its bottom surface, as shown at 375. Examples of these photovoltaic roofing elements are described in more detail in U.S. patent application Ser. No. 12/146,986, which is hereby incorporated herein by reference in its entirety. The tile can be, for example, about 15" wide and about 30" long, with a receptor zone about 14" wide and about 9.5" long, to fit a photovoltaic element commercially available from UniSolar Ovonic. In such an embodiment, the tile can be installed, for example, with about 10" of the butt portion not covered by overlying courses of shingles. Manufacture of polymeric roofing tiles is described in U.S. patent application Ser. No. 12/146,986 and U.S. Patent Application Publication no. 2007/0266562, each of which is hereby incorporated herein by reference in its entirety.

The top surface of the rigid roofing or siding substrate is the surface that is opposite the surface that would be disposed against a roof deck or a substantially vertical exterior surface of a building (e.g., substantially vertical surfaces laterally disposed about a building or a portion of a building, generally at the sides of a building) when installed. The top surface can be formed from a variety of materials. In some embodiments, the top surface is formed from the same material as is the rest of the rigid roofing or siding substrate (e.g., a polymer, or a metal). In other embodiments, the top surface can be formed from a different material than the rest of the rigid roofing or siding substrate. For example, in certain embodiments of the invention, the top surface of the roofing or siding substrate is polymeric (e.g., a polymeric material, or a polymeric coating on a metallic material). In certain embodiments of the invention, the roofing or siding substrate does not have a fluoropolymer at its top surface.

In certain embodiments, the rigid roofing or siding substrate is a roofing substrate. For example, in some embodiments, the rigid roofing or siding roofing substrate is a roofing panel. In such embodiments, roofing panels can be provided, for example, as elongated sheets, which can be transported to the worksite in bundles. The roofing panel can be, for example, formed from a polymeric material, and can be filled with fibers, glass mat, felt, or fabric, and coated with a variety of materials, such as protective or decorative coatings or films, solar reflective materials (e.g., in areas outside of the receptor zones). Installation of the roofing panel can be performed through a variety of mechanical fasteners, adhesives, or any other suitable methods. Adjacent roofing panels can be sealed together where they adjoin. The roofing panels of the present invention can be installed together with conventional roofing panel products, to provide only certain areas of the roof with photovoltaic power generation capability. Roofing panels can be formed, for example, from a single sheet of material with different surfacings formed thereon, or can be formed by combining sheets of material side-by-side so as to make a single panel having different surfacings. Roofing panels are described in more detail, for example, in U.S. patent application Ser. No. 12/268,313, which is hereby incorporated herein by reference in its entirety.

Figure 4:
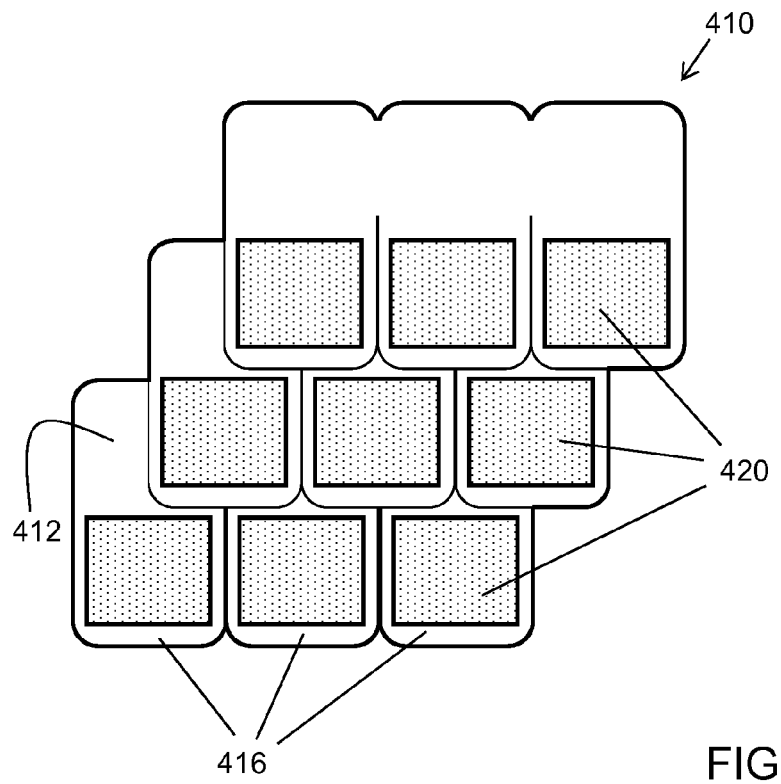
FIG. 4 is top schematic view of a roofing product according to another embodiment of the invention.

In one embodiment, the roofing panel has a top surface formed to provide the appearance of a two-dimensional array of shingles, shakes or tiles, overlapping as they would be when installed on a roof. For example, as shown in top view in FIG. 4, roofing panel 410 is formed with a two-dimensional array of roofing tile elements 416 in its top surface 412. Receptor zones 420 are arranged in a two-dimensional array. The receptor zones can be, for example, about 14" wide and about 9.5" long, to fit a photovoltaic element commercially available from UniSolar Ovonic. The individual roofing tile elements of the roofing panel can be configured with about 10" of length visible (i.e., appearing not to be covered by other courses of roofing tile elements). In other embodiments, roofing panels can be provided in more elongate shapes, so as to fit a plurality of linearly-arranged receptor zones, or a single elongated receptor zone.

A variety of manufacturing processes can be used to make the roofing substrates of the present invention. For example, roofing substrates can be produced by extrusion of a thermoplastic polymer followed by continuous vacuum forming to form a three-dimensional surface relief as described above and/or depressions in which photovoltaic elements can be disposed. In other embodiments, sheet can be extruded and polymeric roofing substrates shaped serially by vacuum forming or compression molding (e.g., as described in U.S. patent application Ser. No. 12/146,986). In other embodiments, a roofing panel substrate can be injection molded to form a plurality of shake-, slate- or tile-like shapes in a single roofing panel substrate.

Figure 5:
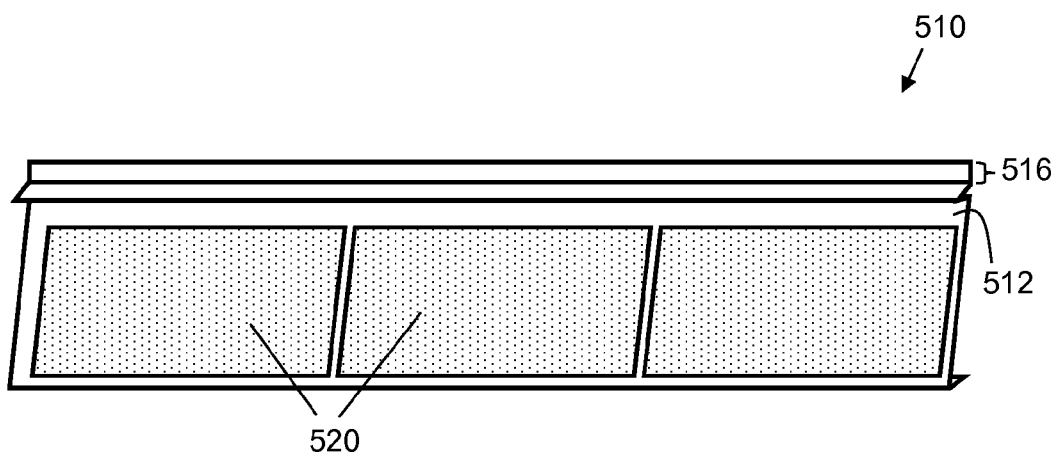
FIG. 5 is a top perspective schematic view of a siding product according to another embodiment of the invention.

In another embodiment, the rigid roofing or siding substrate is a siding substrate. The siding substrate can be, for example, in the form of strips, shakes or panels (which can be formed to give the appearance of a plurality of individual strips or shakes as described above with reference to roofing panels). Siding substrates can be formed from a variety of materials, such as vinyl, aluminum, other sheet metals or thermoplastics. For example, in the embodiment of FIG. 5, a siding substrate 510 is formed as a single strip having three receptor zones 520 arranged linearly on its top surface 512. Siding substrate 510 includes a nailing zone 516 for attachment to a substantially vertical exterior surface of a building. The nailing zone can be, for example, a nailing hem as described in U.S. Pat. Nos. 5,857,303 and 5,729,946, each of which is incorporated herein by reference in its entirety. As shown in FIG. 5, the receptor zones can be offset from one end of the siding substrate, so as to allow an area for horizontal overlap of an adjacent siding substrate, as is conventional.

Figure 6:
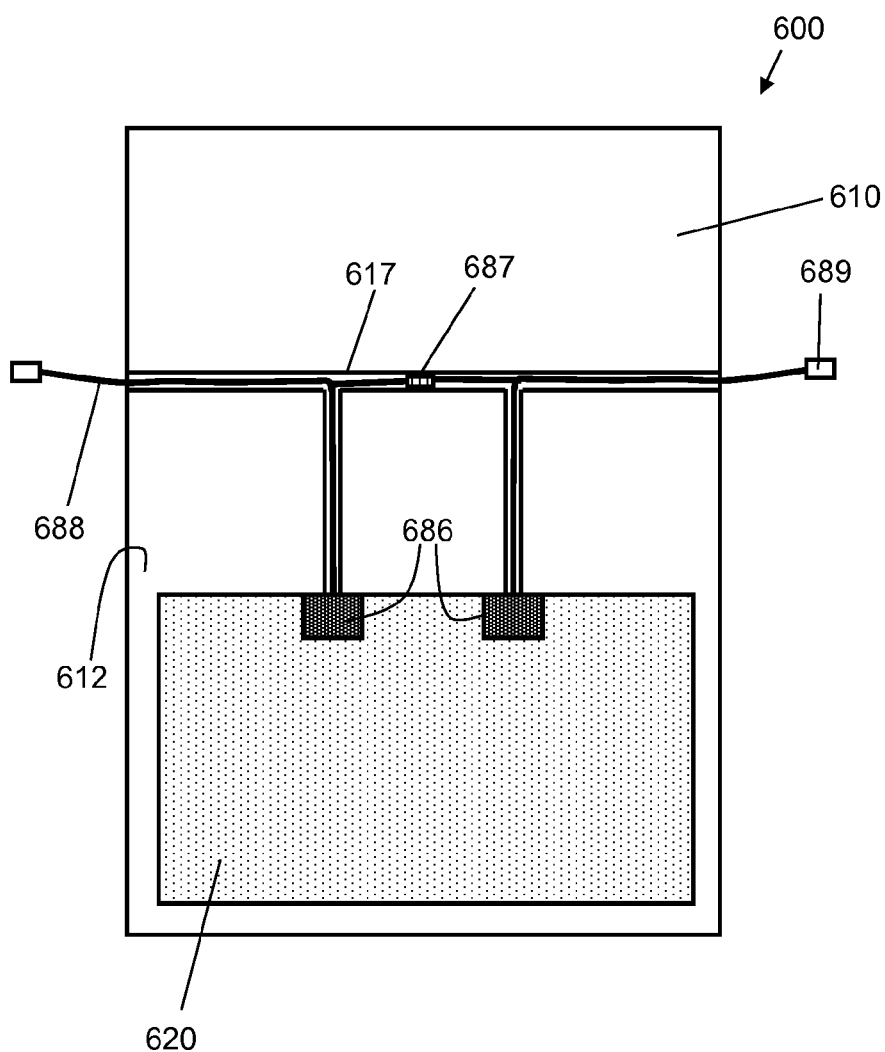
FIG. 6 is a top schematic view of a roofing product according to one embodiment of the invention.

In certain embodiments, the rigid roofing or siding substrate includes wiring configured to interconnect a photovoltaic element disposed thereon into a photovoltaic system. For example, in the embodiment shown in top schematic view in FIG. 6, a roofing product 600 includes rigid roofing substrate 610, which includes a receptor zone 620 for the receipt of a photovoltaic element. It also includes electrical contacts 686 operatively connected to wiring 688 (which is disposed in trenches 617 formed in the top surface 612 of the rigid roofing substrate 610) and configured to contact electrical contacts of a photovoltaic element. Wiring 688 can be, for example, terminated with electrical connectors 689 for interconnection into a photovoltaic system. The wiring can include, for example, a bypass diode 687 to remove the photovoltaic element from the circuit if its resistance is too high (e.g., due to failure or insufficient illumination). The wiring system can also include return path wiring (not shown), as described in U.S. Provisional Patent Application Ser. No. 61/040,376, which is hereby incorporated herein by reference in its entirety. The contacts can be, for example, plugs, sockets, or even areas of conductive material.

In other embodiments, the rigid roofing or siding substrate of a roofing or siding product includes a trench for wiring as described above with reference to FIG. 6, but does not include wiring. Such roofing or siding products can be installed, then a wiring system can be disposed in the trenches, before, after, or in conjunction with the installation of the photovoltaic elements on the receptor zones. Separation of the assembly steps of the wiring and the photovoltaic elements can be beneficial for process flexibility and for logistical planning associated in the assembly of photovoltaic roofing elements, either in a factory setting or on-site.

The surfacing of the one or more receptor zones can be adapted to provide increased adhesion between the rigid roofing or siding substrate and a photovoltaic element (for example, an encapsulated photovoltaic element). Accordingly, the receptor zones can provide areas of increased adhesion for photovoltaic elements, while the remainder of the top surface of the rigid roofing or siding substrate can be surfaced to provide, for example, weather resistance, UV resistance, solar reflectivity, a color or appearance complementary to photovoltaic elements or adjacent areas of the roof or substantially vertical surface of the building, or other desirable properties.

For example, in one embodiment of the invention, the surfacing of the receptor zones is textured. The surfacing can include, for example, a textured layer such as a fabric, scrim, a woven or non-woven web, a felt, a porous film, or a sheet having a microstructured surface. In other embodiments, the surfacing includes a texturing material such as sand, glass or quartz grit, fibers (e.g., polymeric, glass). The textured layer can provide additional surface area for adhesion of the encapsulated photovoltaic element to the rigid roofing or siding substrate. In certain embodiments of the invention, the textured layer can intermingle with the materials of an encapsulated photovoltaic element, the rigid roofing or siding substrate, and/or an adhesive material in order to improve adhesion through mechanical interlocking. A textured layer can be especially useful in conjunction with a polymeric substrate; the textured layer can be embedded in the polymeric material using heat and/or pressure, for example using a compression molding process. In certain embodiments of the invention, the textured layer is a fibrous layer (e.g., scrim, fabric, non-woven web). Textured layers are described in more detail in U.S. Patent Application Publication no. 2008/0248241, which is hereby incorporated herein by reference in its entirety. In certain embodiments of the invention, the material of the textured layer is at least partially embedded in the material of the top surface of the polymeric substrate. For example, in one embodiment, the surfacing includes a textured web (e.g., fiberglass mat) coated on one side (e.g., with a polymeric coating), with its uncoated side embedded in the material of the top surface of the polymeric substrate (e.g., a polymeric roofing substrate) in the receptor zone. In this embodiment, the coating can provide increased adhesion to a photovoltaic element, while the embedded textured web improves adhesion to the polymeric substrate. In other embodiments of the invention, the textured surfacing is achieved by mechanically embossing or chemically etching the top surface of the polymeric substrate in the receptor zone.

Figure 7:
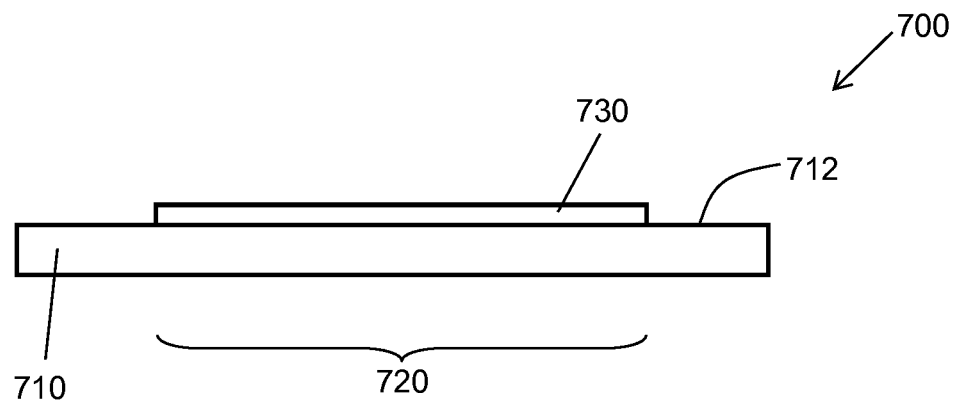
FIG. 7 is a partial schematic cross-sectional view of a roofing or siding product according to another embodiment of the invention.

In other embodiments of the invention, the surfacing of the one or more receptor zones includes a polymer material or a metal foil. For example, as shown in partial schematic cross-sectional view in FIG. 7, roofing or siding product 700 includes rigid roofing or siding substrate 710, which has top surface 712. Disposed on the top surface 712 in the receptor zone 720 is a polymer material 730 (e.g., in film form). The polymer material or metal foil can provide enhanced adhesion to a photovoltaic element (e.g., through a tie layer system such as an adhesive layer, as described below). For example, the surfacing can be a polymer film formed from a polymer such as a fluorinated polymer, an acrylic polymer, a urethane polymer, a polyester, or a polyolefin. In certain embodiments, the surfacing of the one or more receptor zones is formed from a different polymer than that of the polymeric roofing or siding substrate. In other embodiments, the surfacing of the one or more receptor zones includes a metal foil, such as an aluminum foil or a steel foil. For example, in one embodiment, 2 mil thickness deadsoft aluminum foil available from Kaiser Aluminum is laminated to portions of the surface of a polymeric substrate. The polymer film or metal foil can be surface-treated (e.g., as described below) to enhance adhesion.

Figure 8:
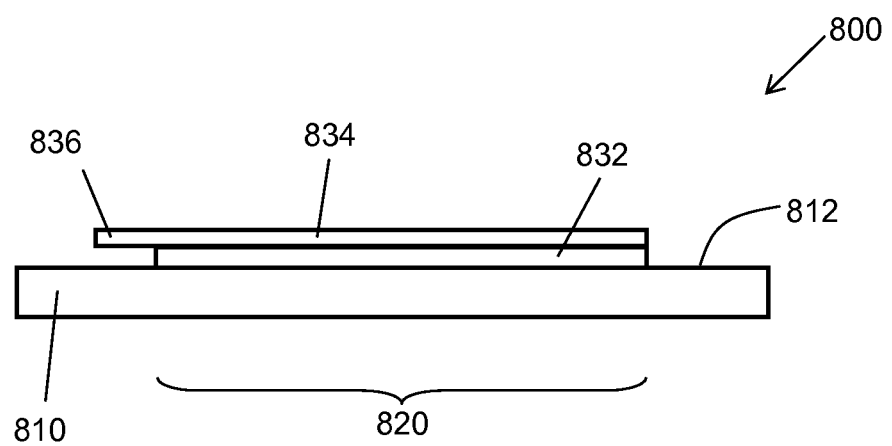
FIG. 8 is a partial schematic cross-sectional view of a roofing or siding product according to another embodiment of the invention.

In another embodiment, the surfacing of the one or more receptor zones includes an adhesive material covered by a releasable liner. For example, as shown in partial schematic cross-sectional view in FIG. 8, roofing or siding product 800 includes rigid roofing or siding substrate 810, which has top surface 812. Disposed on the top surface 812 in the receptor zone 820 is an adhesive material 832 covered by a releasable liner 834. In such embodiments, the releasable liner can be removed (e.g., by peeling using pull tab 836) to expose the adhesive material, which can be used to affix a photovoltaic element to the receptor zone. The releasable liner can be, for example, release-coated paper. The adhesive material can be, for example, a pressure sensitive adhesive such as a functionalized EVA-based pressure-sensitive adhesive (e.g., HP Fuller 9917).

Figure 9:
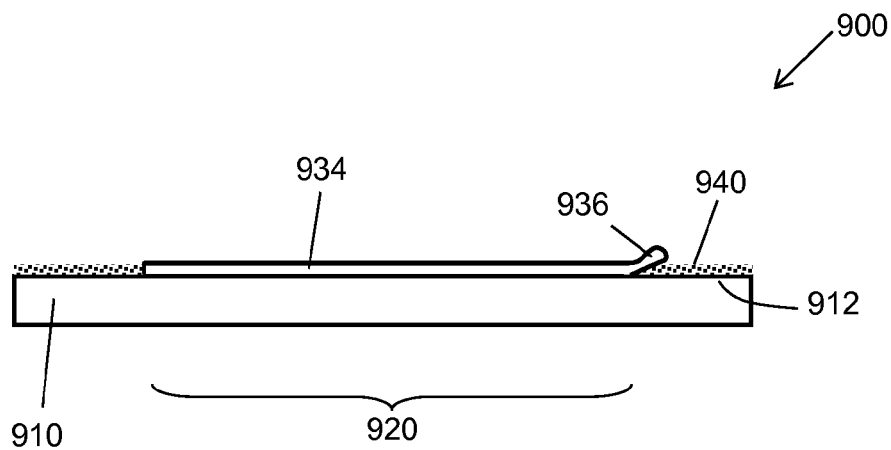
FIG. 9 is a partial schematic cross-sectional view of a roofing or siding product according to another embodiment of the invention.

In another embodiment, the surfacing of the one of more receptor zones includes an uncoated polymer material, optionally covered by a releasable liner. For example, as shown in partial schematic cross-sectional view in FIG. 9, roofing or siding product 900 includes rigid roofing or siding substrate 910 (e.g., a polymeric roofing tile), which has top surface 912. The top surface 912 is coated with a coating material 940 in areas outside the receptor zone 920. In receptor zone 920, the top surface is not coated, but instead is left uncoated and in this embodiment covered by releasable liner 934 (which can optionally include a pull tab 936). In other embodiments, the uncoated polymer material is not covered by a releasable liner. In certain embodiments, a tie layer system (e.g., an adhesive layer) can be used to adhere the photovoltaic element to the receptor zone.

In some embodiments of the invention, the surfacing of the one or more receptor zones is selected so that the appearance of the receptor zone is complementary to the top surface of the rigid roofing or siding substrate in the area adjacent to the receptor zone. As used herein $L^*$, $a^*$ and $b^*$ are the color measurements for a given sample using the 1976 CIE color space. The strength in color space $E^*$ is defined as $E^*=(L^{*2}+a^{*2}+b^{*2})^{1/2}$. The total color difference $\Delta E^*$ between two articles is defined as $\Delta E^* = (\Delta L^{*2} + \Delta a^{*2} \Delta b^{*2})^{1/2}$, in which $\Delta L^*$, $\Delta a^*$ and $\Delta b^*$ are respectively the differences in $L^*$, $a^*$ and $b^*$ for the two articles. $L^*$, $a^*$ and $b^*$ values are measured using a HunterLab Model Labscan XE spectrophotometer using a 0° viewing angle, a 45° illumination angle, a 10° standard observer, and a D-65 illuminant. Lower $L^*$ values correspond to relatively darker tones. In such embodiments, if part or all of a receptor zone is not covered by a photovoltaic element, it can complement the rest of the surface of the rigid roofing or siding substrate. In certain embodiments of the invention, the receptor zone has a $\Delta E^* < 30$ compared to the top surface of the rigid roofing or siding substrate in the area adjacent to the receptor zone. In some embodiments, the receptor zone has a $\Delta E^* < 20$ compared to the top surface of the rigid roofing or siding substrate in the area adjacent to the receptor zone.

In other embodiments, the surfacing of the one or more receptor zones is selected so that the appearance of the receptor zone is complementary to the photovoltaic element with which the roofing product is to be used. In such embodiments, if part or all of a receptor zone is not covered by a photovoltaic element, it can complement the photovoltaic element disposed thereon, or photovoltaic elements disposed on neighboring receptor zones. For example, in certain embodiments of the invention, the receptor zone has a $\Delta E^* < 30$ compared to the photovoltaically active surface of the photovoltaic element. In some embodiments, the receptor zone has a $\Delta E^* < 20$ compared to the photovoltaically active surface of the photovoltaic element.

In embodiments in which the surfacing of the one or more receptor zones are selected to provide appearance complementary to some other aspect of the rigid roofing or siding substrate or a photovoltaic element, the receptor zone can be provided with a desired appearance, for example, through printing or coating. When the receptor zone includes an aluminum foil, a desired appearance can in some embodiments be provided by anodization.

In some embodiments, the surfacing of the receptor zone is stabilized to UV radiation, for example through UV stabilization or through use of UV-resistant materials. In such embodiments, when the receptor zone is not completely occluded by photovoltaic elements, any exposed surface is resistant to UV damage. Such embodiments are especially useful when the rigid roofing or siding substrate is formed from UV-sensitive polymeric material. For example, the surfacing may include ETFE, PVC, acrylic or another UV-resistant polymer film, for example including UV stabilizers and/or antioxidants. Metal foil is opaque to UV, and can alternatively be used. UV-opaque particles can also be used; in such embodiments, it is preferable that such particles have substantially complete coverage over the surface of the receptor zone. For example, in one embodiment, the surface of the receptor zone is at least partially covered by small granules, for example roofing granules of #18 or #22 size, so that any areas of the receptor zone that are not blocked by a photovoltaic element are protected from UV damage.

In certain embodiments, the surfacing of the receptor zone is both stabilized to UV radiation and selected so that the appearance of the receptor zone is complementary to the photovoltaic element with which the roofing product is to be used, adjacent areas of the rigid roofing or siding substrate, as described above. In such embodiments, any portion of the receptor zone that remains exposed can be UV resistant and complementary in appearance to other parts of the rigid roofing or siding substrate or the photovoltaic elements used therewith.

Figure 10:
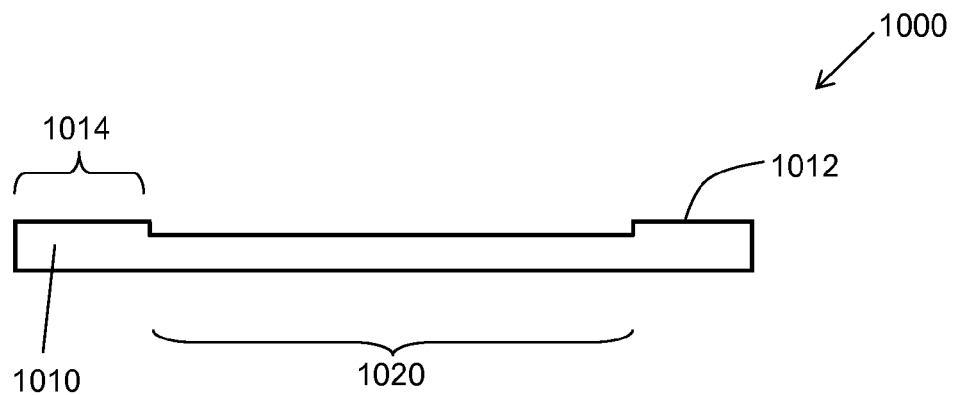
FIG. 10 is a partial schematic cross-sectional view of a roofing or siding product according to another embodiment of the invention.

In certain embodiments of the invention, the top surface of the rigid roofing or siding substrate in the receptor zone is recessed from the top surface of the rigid roofing or siding substrate in the area adjacent to the receptor zone. For example, as shown in partial schematic cross-sectional view in FIG. 10, roofing or siding product 1000 includes rigid roofing or siding substrate 1010, which has a top surface 1012. The top surface of the rigid roofing or siding substrate in the receptor zone 1020 is recessed from the top surface of the rigid roofing or siding substrate in the area 1014 adjacent to the receptor zone 1020. In certain such embodiments, when a photovoltaic element is disposed in the receptor zone, its top surface can be substantially flush (e.g., within 2 mm vertical difference) with the top surface of the area adjacent to the receptor zone.

In some embodiments of the invention, the surfacing of the one or more receptor zones includes one or more alignment marks (e.g., printed or embossed) to aid in the alignment and installation of a photovoltaic element. For example, the alignment marks can correspond with the visible separations between sets of photovoltaic cells in the photovoltaic element. In other embodiments, the alignment marks can correspond with markings formed on the top surface and/or the bottom surface (e.g., the bottom surface of an adhesive layer) of the photovoltaic element. In other embodiments, the alignment marks can correspond to markings formed on a surface of a releasable liner (e.g., the surface in contact with an adhesive layer, or the bottom surface); as the releasable liner is removed to expose the adhesive layer (e.g., when the photovoltaic element is supplied in roll form), the installer can use it as a guide to ensure alignment of the photovoltaic element to the receptor zone. The use of alignment marks can be especially useful when using photovoltaic elements in strip form, as the potential for alignment is higher for long, thin strips (e.g., Uni-Solar Ovonic strip photovoltaic element). The use of alignment marks in the receptor zone can be especially useful when the photovoltaic element is smaller than the receptor zone, so that the alignment marks are visible when the photovoltaic element is disposed thereon.

In other embodiments, the rigid roofing or siding substrate includes one or more alignment marks (e.g., printed or embossed) in the area adjacent the receptor zone to aid in the alignment and installation of a photovoltaic element. The alignment marks can be as described above for the alignment marks in the receptor zone. For example, the alignment marks can correspond with the visible separations between sets of photovoltaic cells in the photovoltaic element. In other embodiments, the alignment marks can correspond with markings formed on the top surface of the photovoltaic element.

In certain embodiments, the top surface of the rigid roofing or siding substrate has solar reflective properties, for example through a solar reflective coating. Solar reflectance can reduce the effective temperature of the roof or substantially vertical building surface, which can improve the efficiency of power generation of the photovoltaic elements disposed thereon, as described in U.S. patent application Ser. No. 12/266,481, which is hereby incorporated herein by reference in its entirety. In some such embodiments, the top surface of the rigid roofing or siding substrate does not have solar reflective properties in the one or more receptor zones, resulting in more economical use of solar reflective coating or solar reflective roofing granules. Similarly, in some embodiments, the solar reflective properties do not extend to areas of the rigid roofing or siding substrate which are not visible when installed (e.g., the headlap region of a tile, shake or shingle).

Figure 11:
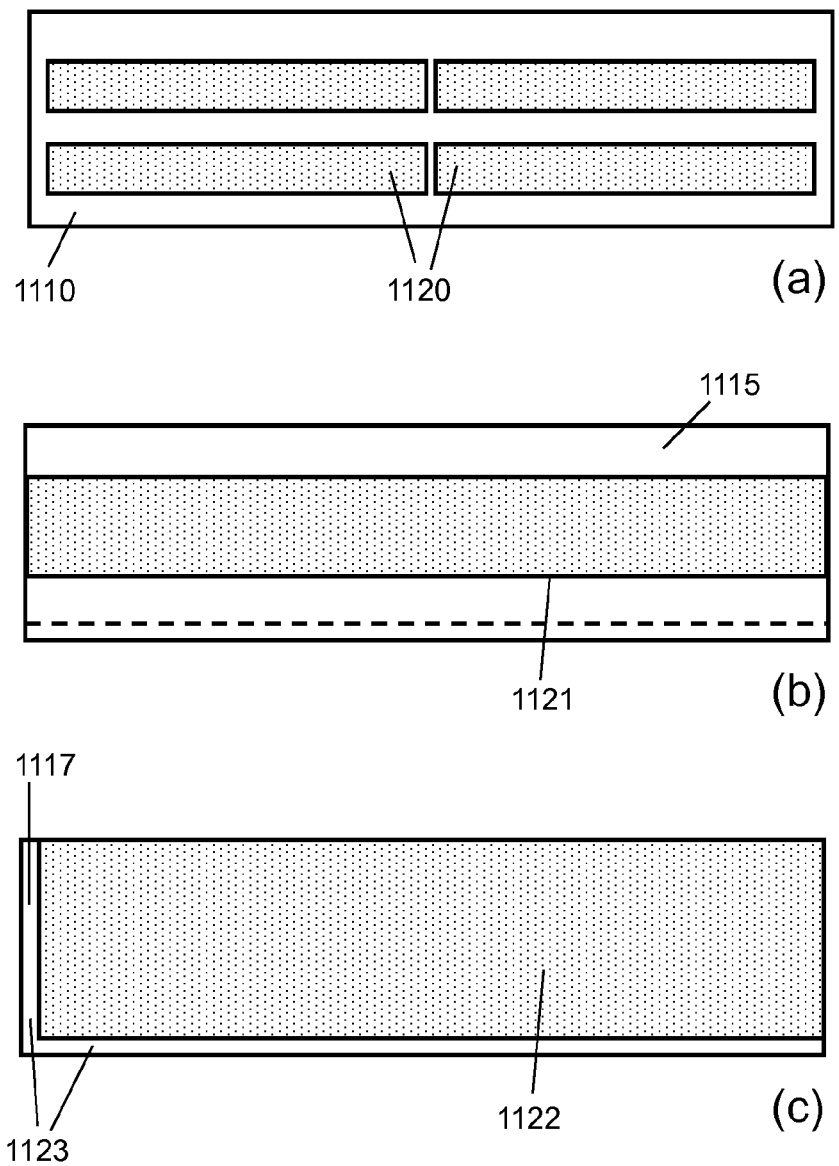
FIG. 11 is top schematic view of roofing or siding products according to other embodiments of the invention.

The one or more receptor zones can be provided on the rigid roofing or siding substrate in a wide variety of geometries. For example, they can be provided as islands or isolated zones; or alternatively can extend the length of a rigid roofing or siding substrate. For example, in one embodiment, as shown in FIG. 11(a), the receptor zones 1120 are formed as isolated zones on the top surface of a roofing panel 1110. In another embodiment, as shown in FIG. 11(b), a receptor zone 1121 is formed to continuously extend along the length of a roofing panel 1115, as shown in FIG. 11(b). In other embodiments, the receptor zone 1122 is formed to cover the entire surface of a roofing panel 1117 except for one or more overlap zones 1123 formed along one or more edges, as shown in FIGS. 11(b) and 11(c). Similar geometries can be used in siding products of the present invention.

The one or more receptor zones can be formed on the rigid roofing or siding substrate in a variety of ways. For example, the receptor zones can be formed at the same time as the rest of the rigid roofing or siding substrate, for example by coextrusion or compression molding (e.g., using an in-mold lamination process). In other embodiments, the receptor zones are formed after the rigid roofing or siding substrate is constructed, for example by lamination, coating or embossing techniques.

Figure 12:
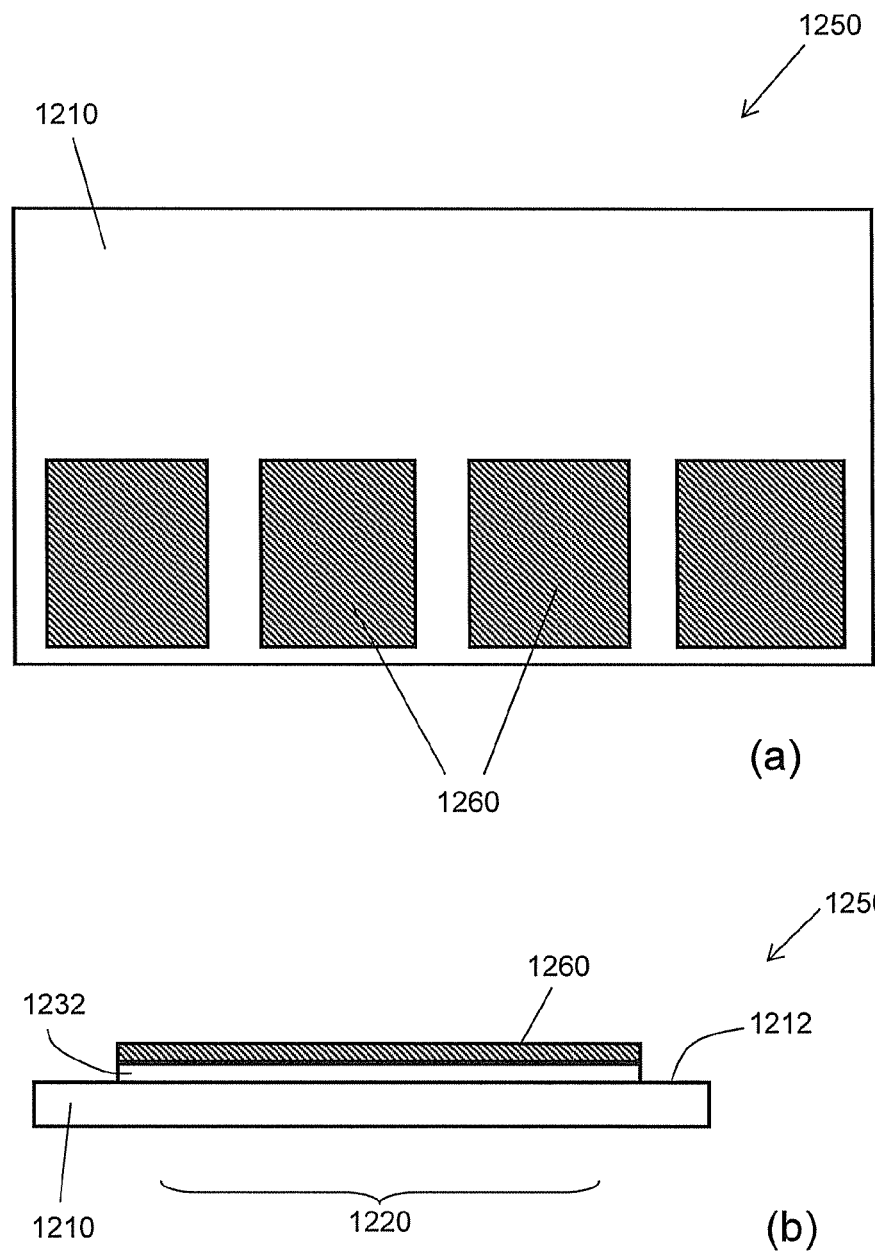
FIG. 12 is a top schematic view and a schematic partial cross-sectional view of a photovoltaic roofing element according to the invention.

Another aspect of the invention is a photovoltaic roofing or siding element, for example as shown in schematic top perspective view and in schematic partial cross-sectional view in FIG. 12. Photovoltaic roofing or siding element 1250 includes a rigid roofing or siding substrate 1210 having a top surface 1212, the top surface having one or more (in this example, four) receptor zones 1220 thereon, each receptor zone being adapted to receive one or more photovoltaic elements, each receptor zone having a different surfacing than the area of the top surface adjacent to it, as described above. Photovoltaic roofing or siding element 1250 further comprises one or more photovoltaic elements 1260 disposed in the one or more receptor zones of the top surface of the rigid roofing or siding substrate. The one or more photovoltaic elements can be adhered to the top surface of the rigid roofing or siding substrate in the receptor zones as described above. For example, as shown in FIG. 12, a tie layer system (e.g., adhesive material) 1232 can adhere each photovoltaic element 1260 to the top surface 1212 of rigid roofing or siding substrate 1210 in receptor zones 1220. In the receptor zone, the top surface can include, as described above, a polymer or metal film, texturing, or a self-adhesive material (not shown).

In another aspect of the invention, a photovoltaic roofing system comprises one or more photovoltaic roofing elements as described herein disposed on a roof deck. In another aspect of the invention, a photovoltaic siding system comprises one or more photovoltaic siding elements as described above disposed on a substantially vertical exterior surface of a building. The photovoltaic roofing and siding elements can be disposed with a certain amount of overlap to provide a waterproof covering, as is conventional in the roofing and siding arts. The photovoltaic roofing or siding system can include a wiring system as described above, and as described in U.S. patent application Ser. No. 11/743,073, which is hereby incorporated herein by reference in its entirety. The photovoltaic elements of the photovoltaic roofing or siding elements are desirably connected to an electrical system, either in series, in parallel, or in series-parallel, as would be recognized by the skilled artisan. Electrical connections can be made using electrical connectors, such as those available from Tyco International. There can be one or more layers of material, such as underlayment or sheathing, between the roof deck or building and the photovoltaic roofing or siding elements of the present invention. The photovoltaic roofing or siding elements of the present invention can be installed on top of an existing roof or over existing siding; in such embodiments, there would be one or more layers of standard (i.e., non-photovoltaic) roofing or siding elements (e.g., asphalt coated shingles or wooden clapboards) between the roof deck or building and the photovoltaic roofing or siding elements of the present invention. Electrical connections are desirably made using cables, connectors and methods that meet UNDERWRITERS LABORATORIES and NATIONAL ELECTRICAL CODE standards. Even when the photovoltaic roofing or siding elements of the present invention are not installed on top of preexisting roofing or siding materials, the roof or substantially vertical exterior surface of the building can also include one or more standard roofing or siding elements, for example to provide weather protection at the edges of the roof or building, or in any hips, valleys, and ridges of the roof or corners of the building, or in areas not suitable for photovoltaic power generation.

In certain photovoltaic roofing or siding elements of the invention, at least about 70%, at least about 80%, or even at least about 90% of the total receptor zone area of at least one rigid roofing or siding substrate is covered by photovoltaic elements.

In certain photovoltaic roofing or siding systems of the invention, at least about 70%, at least about 80%, or even at least about 90% of the total receptor zone area of all rigid roofing or siding substrates is covered by photovoltaic elements.

A tie layer system can be used to adhere the photovoltaic element in the receptor zone of the top surface of the rigid roofing or siding substrate, as described in U.S. patent application Ser. No. 12/266,409, which is hereby incorporated herein by reference in its entirety. The tie layer system can include layers that are provided together with the photovoltaic element, the rigid roofing or siding substrate on which the photovoltaic element is disposed, or both. For example, when the tie layer system is a layer of adhesive material, it can be provided as a layer on the rigid roofing or siding substrate (e.g., as described above with respect to FIG. 8); as a layer of adhesive on the bottom of the photovoltaic element (e.g., exposed by removing a release liner); or both.

In certain embodiments of the invention, the tie layer system is a polymeric tie layer system (i.e., it comprises one or more polymer layers). For example, in one embodiment of the invention, the tie layer system consists of a single polymer layer. In other embodiments of the invention, the tie layer system consists of a plurality of polymer layers. For example, a tie layer system can include an adhesive layer and a reinforcing layer and/or a surface activation layer. Yet in another example, the tie layer system can comprise other layers of structural features, such as woven or nonwoven mat, a fibrous surface, a patterned surface, a nano-structured surface, or blends of various materials to improve the bonding. In some embodiments, the tie layer system has a stratified structure, for example having an upper surface and a lower surface, each of which has different surface chemistry. For example, each surface can be adapted to adhere to a different adherend.

Especially suitable tie layer systems provide sufficient bond strength to join the bottom surface of the photovoltaic element to the top surface of the rigid roofing or siding substrate, and should be able to withstand severe outdoor weathering. In one embodiment of the invention, the tie layer system provides greater than 10 lb/inch adhesive bond strength in a 90° peel test. In certain embodiments, the tie layer system maintains the bond strength in severe outdoor conditions for an extended period of time, e.g., 20 years of service life. The tie layer system can, for example, meet the humidity-freeze cycle test, thermal cycle test, and damp-heat test requirements listed in IEC 1646. Moreover, in certain embodiments the materials of the tie layer system can flexibly be incorporated through use of a variety of adhesive processes.

A polymeric tie layer system can act to adhere the photovoltaic element to the rigid roofing or siding substrate, especially when they are formed of partially incompatible materials (for example, when the photovoltaic element is an encapsulated photovoltaic element having a fluoropolymer at its bottom surface). In one embodiment of the invention, the tie layer system consists of a single polymer layer having a surface tension in the range of about 25% to about 75% of the way between the surface tension value of the top surface of the rigid roofing or siding element and the surface tension value of the bottom surface of the photovoltaic element.

In one embodiment of the invention, the tie layer system includes a polymeric material having a Chang viscoelastic window exhibiting at least one set of coordinates (log (G"), log (G')) lying within the window bound by the coordinates (4.5, 3), (4.5, 6), (6, 6), (6, 3) (e.g., pressure sensitive adhesives). In certain embodiments of the invention, the polymeric material has a Chang viscoelastic window exhibiting at least one set of coordinates (log (G"), log (G')) lying within the window bound by the coordinates (4.5, 6), (6, 6), (6, 3.7). In other embodiments of the invention, the polymeric material has a Chang viscoelastic window exhibiting at least one set of coordinates (log (G"), log (G')) lying within the window bound by the coordinates (4.5, 6), (4.5, 8), (8, 8), (8, 3.7), (6, 3.7). In other embodiments of the invention, the polymeric material has a Chang viscoelastic window exhibiting at least one set of coordinates (log (G"), log (G')) lying within the window bound by the coordinates (4.5, 6), (4.5, 8), (8, 8), (8, 3.7), (6, 3.7), (6, 6). G" is the viscous shear modulus in units of Pa, and G' is the elastic shear modulus in units of Pa. G and G" can be measured as described in ASTM 882-97, for example at frequencies of 0.01 R/S and 100 R/S. Dissipative materials generally have Chang viscoelastic window coordinates within the above-referenced windows. Such materials are described in more detail in U.S. Pat. No. 6,869,981, and at pages 171-184 of Handbook of Pressure Sensitive Adhesive Technology, 3rd Ed., D. Satas editor, 1999, each of which is hereby incorporated herein by reference in its entirety; the UV curable materials described therein can be converted to heat-curable materials by changing initiators. Other examples include VHB adhesive materials available from 3M.

In certain embodiments of the invention, the tie layer system has a coefficient of thermal expansion ("CTE") between the CTE of the top surface of the rigid roofing or siding substrate and the CTE of the bottom surface of the photovoltaic element, measured at 100° F. In one embodiment of the invention, the tie layer system has a CTE in the range of about 25% to about 75% of the way between the CTE of the top surface of the rigid roofing or siding substrate and the CTE of the bottom surface of the photovoltaic element, measured at 100° F. In certain embodiments of the invention, the top surface of the roofing element is polypropylene with a CTE of $\sim 4 \times 10^{-5}$ in/in/° F.

In certain embodiments of the invention, the tie layer materials are not conductive. In such embodiments, the photovoltaic elements do not require additional grounding to prevent electric shock or to meet electrical code requirements.

In certain embodiments, the tie layer system includes a layer of thermoplastic that is activatable to form a bond with the bottom surface of a photovoltaic element. Such thermoplastic materials include, for example, hotmelt adhesives that can be locally softened or molten by infrared irradiation, CalRod heaters, microwave irradiation, induction heating, magnetic induction heating, gyrotron processing, laser heating, ultrasonic welding or vibrational welding techniques.

In certain embodiments, the tie layer system includes a polymeric adhesive. In some such embodiments, the adhesive is of sufficient thickness that it can be cut with a hot knife or hot wire to remove the photovoltaic element, for example, at least about 1 mm in thickness or at least about 2 mm in thickness, or, in some cases, at least about 3 mm in thickness. Rigid polymeric materials can have functional lifetimes on the order of fifty years or more. It can be desirable to replace photovoltaic elements, for example when they fail or have been surpassed in performance by newly-developed photovoltaic elements.

In some embodiments of the invention, the tie layer system can include one or more materials selected from the group consisting of a polyolefin functionalized with carboxylate and/or anhydride (e.g., maleic anhydride); ethylene vinyl acetate (optionally modified with anhydride); acid-modified polyolefins (e.g., ethylene/(meth)acrylic acid); a combination of an acid-modified polyolefin with an amine-functional polymer; maleic anhydride-grafted EPDM; a hot melt containing a thermoplastic or elastomeric fluoropolymer; and a curable resin (e.g., an epoxy resin such as a BondiT from Reltek LLC, or an ethylenically-unsaturated resin), butyl adhesives, or pressure-sensitive adhesives. Examples of such materials are described, for example, in U.S. Pat. Nos. 6,465, 103; 6,632,518; 7,070,675; 6,524,671; 5,143,761; and 6,630, 047, each of which is hereby incorporated herein by reference in its entirety.

In certain embodiments of the invention, the tie layer system is a blend of functionalized EVA and polyolefin (e.g., polypropylene). For example, the tie layer system can contain 5-75% by weight of polyolefin (e.g., 15-55%). The tie layer system can be, for example, a 70% polypropylene/30% EVA blend, or a 50% polypropylene/50% EVA blend. In other embodiments of the invention, the tie layer system includes (or consists essentially of) an EVA-based PSA (e.g., HB Fuller HL2688PT); EVA (e.g., DuPont Bynel 3860); maleic acid-grafted EVA (e.g., DuPont Bynel E418); maleic acid grafted polypropylene (e.g., Equistar Plexar 6002); an epoxy/maleic acid grafted ethylene/butyl acrylate polymer (e.g., Arkema Lotader AX8900); a blend of polypropylene, PVDF and functionalized EVA-based pressure-sensitive adhesive (e.g., 50% polypropylene, 25% Arkema 2500, 25% HP Fuller 9917); a polyethylene/polypropylene copolymer (e.g., Dow Versify DE2300 having 12% ethylene content); or a functionalized EVA-based pressure-sensitive adhesive (e.g., HP Fuller 9917). In such embodiments, the top surface of the rigid roofing or siding substrate can be, for example, polyolefin (e.g., polypropylene).

In other embodiments of the invention, the tie layer system comprises an amino-substituted organosilane layer, for example as described in U.S. Pat. No. 6,753,087, which is hereby incorporated herein by reference. For example, the tie layer system can comprise a polymeric layer (e.g., having polar functionality) having blended therein an amino-substituted organosilane.

The thickness of the tie layer system can be, for example, in the range of about 25 µm to about 2.5 mm. In certain embodiments of the invention, the thickness of the tie layer system is in the range of about 50 µm to about 1 mm.

Examples of various processes for completing the bonding of the tie layer between the bottom layer of the photovoltaic element and the top surface of the rigid roofing or siding substrate (in the receptor zone) may include, for example, compression molding, injection molding, co-extrusion, lamination, vacuum lamination (e.g., to remove air bubbles and outgassing), ultrasonic welding, vibration welding, laser welding, and IR welding. The method for completing the bonding will depend on whether the bonding is to be completed at a worksite (e.g., after installation of the rigid roofing or siding substrate on a roof deck or substantially vertical exterior surface as described below) or in a factory setting. Equipment intensive processes such as lamination and molding are especially suited to be performed in a factory setting; while use of adhesive materials can be suitable for use on site. In certain embodiments, an adhesive material is provided on the photovoltaic element, the receptor zone, or both, and is covered by a releasable liner, as described above. Peeling the liner can expose the adhesive material, which can adhere the photovoltaic element to the top surface of the rigid roofing or siding substrate.

In some embodiments of this invention, the top surface of the rigid roofing or siding substrate or the bottom surface of the photovoltaic element or both can be surface treated to enhance their affinity to each other, or to the tie layer system, if used. Examples of the surface treatments include flame treatment, plasma treatment, corona treatment, ozone treatment, sodium treatment, etching, ion implantation, electron beam treatment, or combinations thereof Surface treatments can also include chemical modification with reactive organic species such as polymerizable monomers, or coupling agents such as organosilanes, organozirconates or organotitanates.

In certain embodiments, a mechanical fastener is used together with a tie layer system (e.g., adhesive layer) to attach the photovoltaic element to the receptor zone of the top surface of the rigid roofing or siding substrate. The mechanical fastener can be, for example, nails, staples, screws, clips or the like; such fasteners can attach the photovoltaic element only to the rigid roofing or siding substrate on which it is disposed, or can go through the rigid roofing or siding substrate down to underlying roofing or siding substrates, or even through to the roof deck or substantially vertical exterior surface itself. The mechanical fastener can provide for additional security of attachment of the photovoltaic element under conditions of steep slope or high temperature, where a tie layer system may be subject to shear stresses. The mechanical attachment can be particularly helpful on the lower edge of the photovoltaic element to prevent sliding movement down the roof or substantially vertical exterior surface. Moreover, mechanical attachment at the lower edge may impart added resistance to wind uplift detachment of the photovoltaic element or the rigid roofing or siding substrate. Mechanical attachment at one edge of the photovoltaic element can also allow a degree of movement within the tie layer system to accommodate differential thermal expansion and contraction between the photovoltaic element and the rigid roofing or siding substrate.

Figure 13:
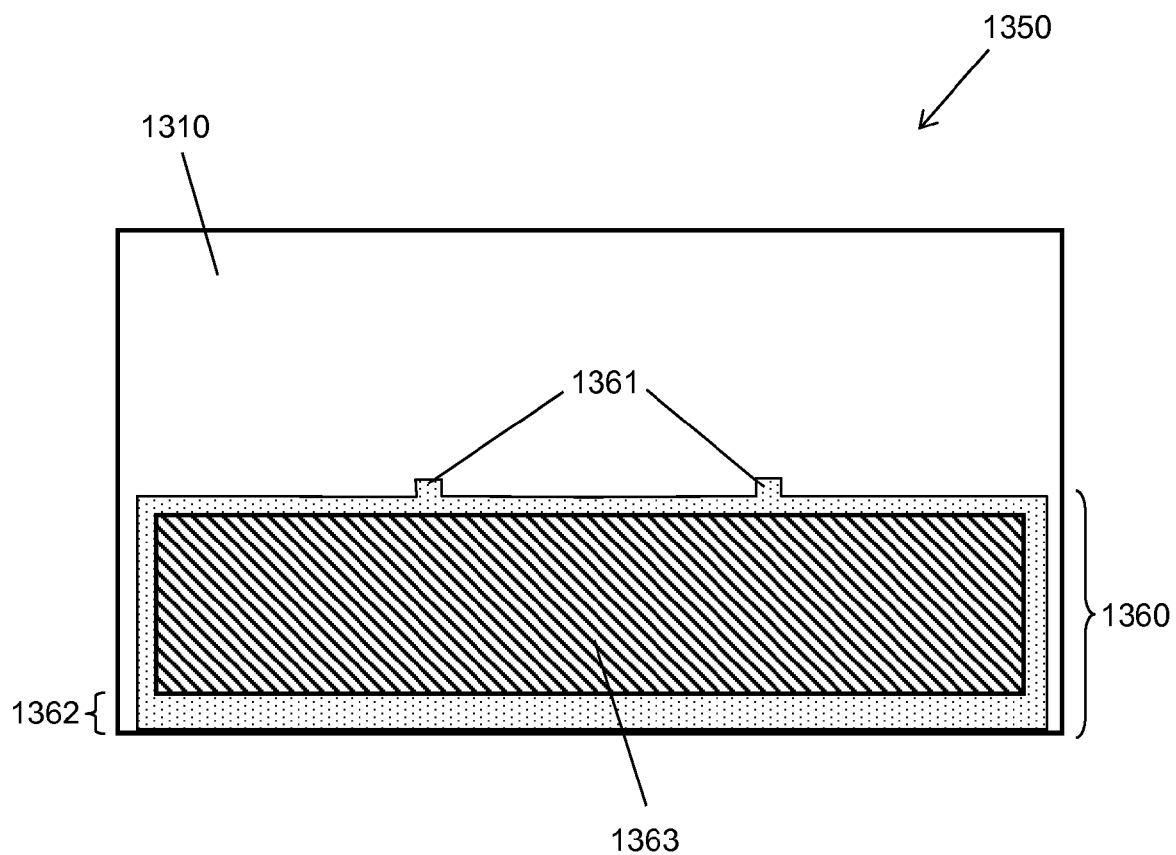
FIG. 13 is a schematic top view of a photovoltaic roofing or siding element according to one embodiment of the invention.

In some embodiments, the photovoltaic element will include fastening tabs or a fastening zone (e.g., a marked area) to aid in the attachment of the photovoltaic element to the receptor zone of the top surface of the rigid roofing or siding substrate. Fastening zones and tabs may be configured using a flexible material, such as described in U.S. Pat. Nos. 5,729, 946; 5,857,303; 5,887,743; 5,857,303 and 6,000,185, each of which is hereby incorporated by reference in its entirety. Flexible fastening zones can help to accommodate movement between the photovoltaic element and the rigid roofing or siding substrate, for example due to differential thermal expansion. For example, in one example of a photovoltaic roofing element 1350 of the invention, shown in top view in FIG. 13, photovoltaic element 1360 (having photovoltaically active area 1363) is disposed in the receptor zones of rigid roofing or siding substrate 1310. Photovoltaic element 1360 includes both fastening tabs 1361 and a fastening zone 1362. The fastening tabs 1361 and fastening zone 1362 denote places that where fastening will cause no damage to the photovoltaic element (e.g., areas devoid of photovoltaic cells or electrical components such as wiring). The fastening tabs can in some embodiments be covered by an overlying course of roofing or siding material. In certain embodiments, the photovoltaic element includes fastening tabs (e.g., as denoted by 1361 in FIG. 13), but no other fastening zone.

Figure 14:
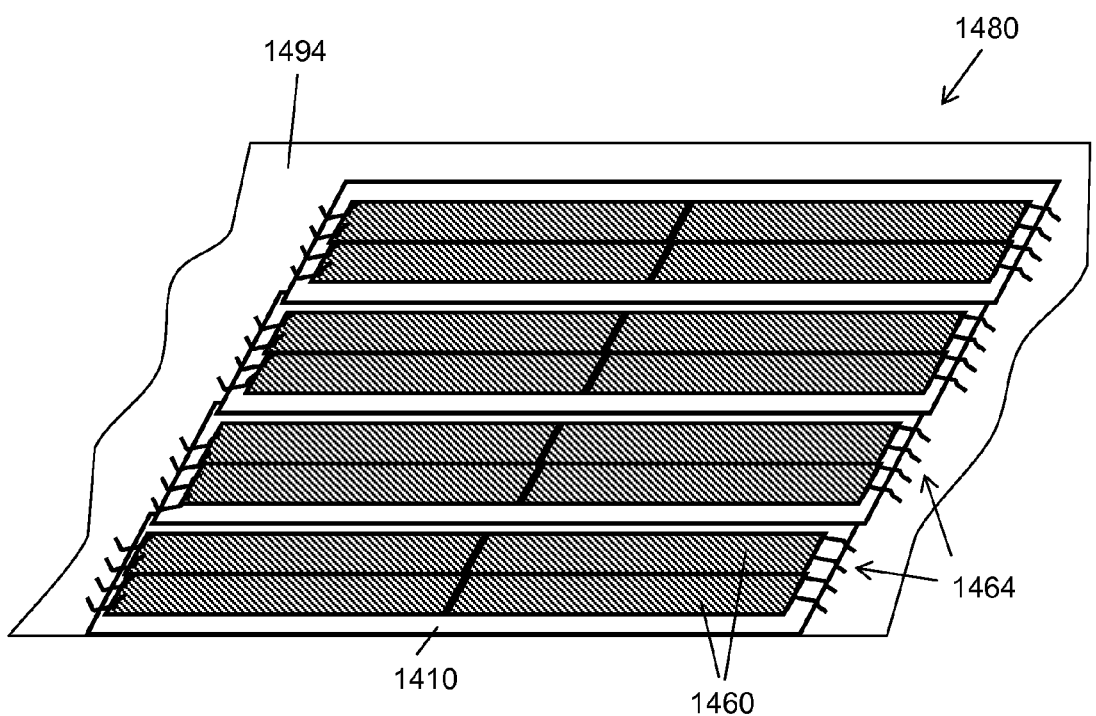
FIG. 14 is a top perspective schematic view of a photovoltaic roofing system according to the invention.

In one embodiment of the invention, shown in schematic top perspective view in FIG. 14, each rigid roofing or siding substrate 1410 is a roofing panel, four of which are shown applied to a roof deck 1494 in overlapping strips to form a photovoltaic roofing system 1480. A receptor zone is disposed longitudinally on the top surface of each roofing panel, spaced somewhat away from the substantially vertical edges. The dimensions of the receptor zones can be selected to accommodate one or more desired photovoltaic elements. For example, the roofing panel can be about 1 m in width and about 10 m in length. One currently available photovoltaic element is an encapsulated photovoltaic strip, about 40 cm in width and about 5 m in length. Accordingly, up to four such photovoltaic strips 1460 can fit in an appropriately-sized receptor zone on such a roofing panel 1410. In certain embodiments, the photovoltaic elements have one or more electrical connections (e.g., electrodes, electrical connectors, wires or cables optionally terminated with connectors). The electrical connections can be used to interconnect the photovoltaic element with other photovoltaic elements or with a wiring system for take-off of electrical power. In FIG. 14, the photovoltaic strips 1460 have connectorized wires 1464 at one of their longitudinal ends. In the embodiment of FIG. 14, the electrical connections (1464) are at a longitudinal end of the roofing panel 1410.

In certain embodiments, the lengths of the photovoltaic elements and the roofing panel are chosen so that the length of the roofing panel is slightly greater than twice (e.g., 200-220% of) the length of the photovoltaic elements. In one embodiment, the photovoltaic elements are disposed in the receptor zone(s) so that at least one of the elements has an electrical connection at a longitudinal end of the roofing panel, as shown in FIG. 14. In another embodiment, the photovoltaic elements are disposed so that at least one of the photovoltaic elements has an electrical connection at the longitudinal center of a roofing panel. At the point where electrical connections are to be made, a wiring system or bus system can be provided to collect the electrical power generated by the photovoltaic elements.

In embodiments in which multiple photovoltaic elements are disposed adjacent to one another in a receptor zone, waterproofing may be provided via an optional bead of an adhesive, caulk or other sealant between adjacent photovoltaic elements. Alternatively, a pressure sensitive adhesive tape with a backing layer stabilized for outdoor performance can be used to seal the seams between adjacent photovoltaic elements.

Figure 15:
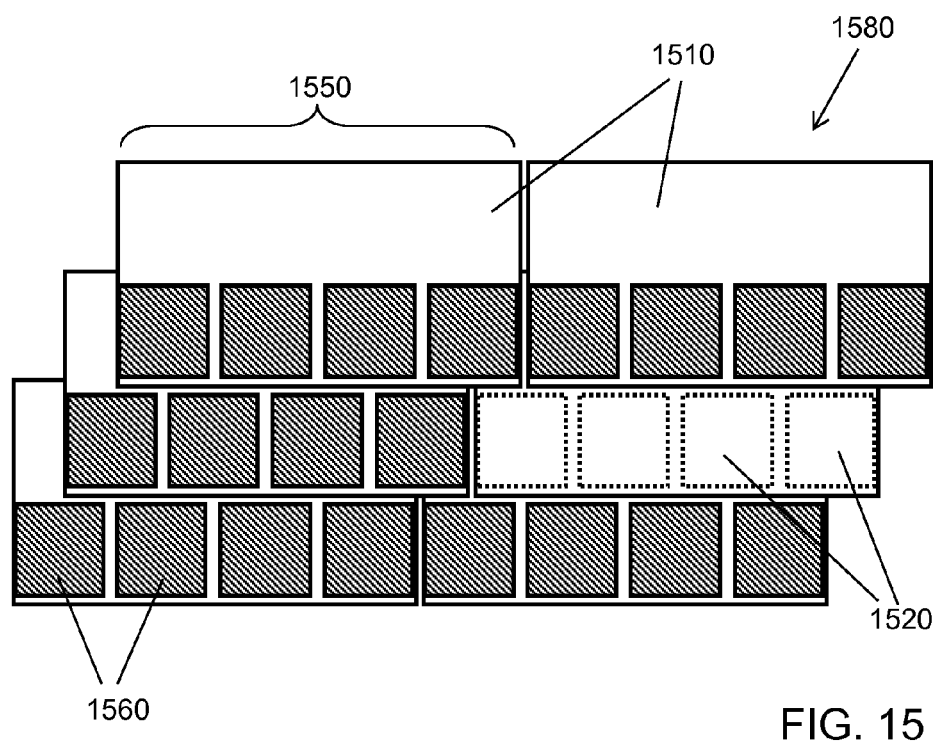
FIG. 15 is a top schematic view of a photovoltaic roofing system according to one embodiment of the invention.
Figure 16:
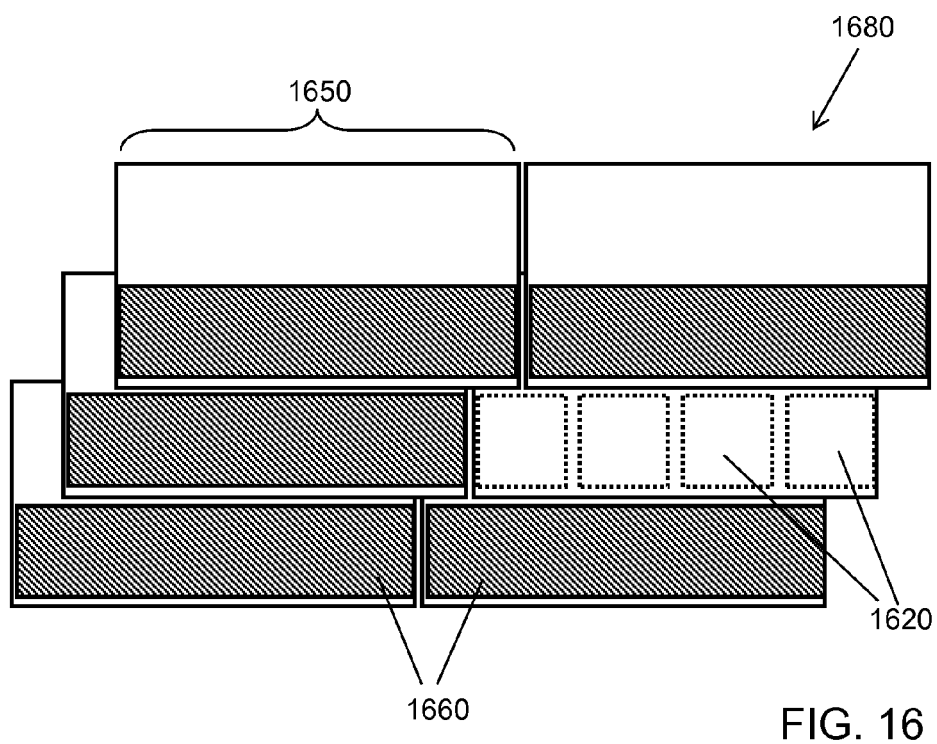
FIG. 16 is a top schematic view of a photovoltaic roofing system according to another embodiment of the invention.

Photovoltaic roofing elements based on tiles, shingles or shakes can be arrayed on a roof deck in a variety of ways. For example, in the photovoltaic roofing system 1580 shown in top schematic view in FIG. 15, photovoltaic roofing elements 1550 are arrayed as laterally-offset courses of tiles. Each roofing substrate 1510 is a tile, with a receptor zone 1520 (shown exposed on three tiles) on its top surface. Photovoltaic elements 1560 are disposed in the receptor zones 1520. In one example, each tile has an exposure height of 8 inches and an overall dimension of 18 inches by 36 inches, with four receptor zones in the exposure area. A T-cell photovoltaic element (Uni-Solar Ovonic) equipped with a pressure-sensitive adhesive is attached to each of the receptor zones of each tile. In the photovoltaic roofing system 1680 of FIG. 16, a single photovoltaic element 1660 is disposed over all four receptor zones 1620 of each photovoltaic roofing element 1650.

Figure 17:
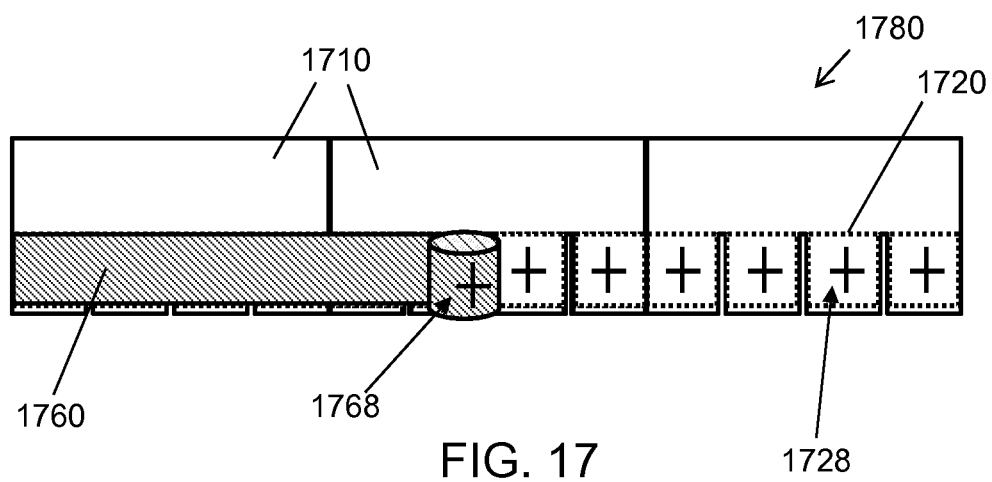
FIG. 17 is a top schematic view of a photovoltaic roofing system according to another embodiment of the invention.

In certain embodiments, the receptor zone spans the length of the exposed section of each roofing or siding product. The roofing or siding products can be applied (e.g., in a typical fashion) by a roofing or siding professional, who need not have any particular expertise with respect to photovoltaic systems. One or more extended length photovoltaic elements can then be disposed in the receptor zones as described above, spanning the length of a plurality of roofing or siding products. For example, the exposure height of each roofing or siding product could be substantially covered by the photovoltaic element. In the photovoltaic roofing system 1780 shown in FIG. 17, a course of three polymeric roofing tiles 1710 is arrayed on a roof deck. The tiles have receptor zones 1720, which include alignment marks 1728 as described above. The photovoltaic element 1760 is provided as a strip, in roll form, and has alignment marks 1768 on its bottom surface. As the photovoltaic element is unrolled and disposed on the receptor zones, the installer can align the alignment marks on the photovoltaic element with those on the receptor zone to ensure proper placement. Of course, alignment marks could alternatively (or also) be provided on the releasable liner.

In certain embodiments of the invention, a receptor zone can have disposed therein a piece of roofing or siding material (e.g., polymeric roofing material or siding material). In some cases (e.g., for aesthetic reasons or to avoid putting photovoltaic elements in shaded areas), it may not be desired to equip a given receptor zone with a photovoltaic element. The roofing or siding material can further protect the receptor zone from weathering, and better match the appearance of the unused receptor zone with the rest of the roof or substantially vertical exterior surface of the building. The roofing material can be, for example, an appropriately-sized piece of polymeric roofing material or siding material having on its bottom surface an adhesive layer covered by a releasable liner. The installer can peel-and-stick the pieces of roofing or siding material to the desired receptor zones. In certain photovoltaic roofing or siding systems of the invention, at least about 70%, at least about 80%, or even at least about 90% of the total receptor zone area of the rigid roofing or siding substrates is covered by photovoltaic elements and/or pieces of roofing or siding material.

Figure 18:
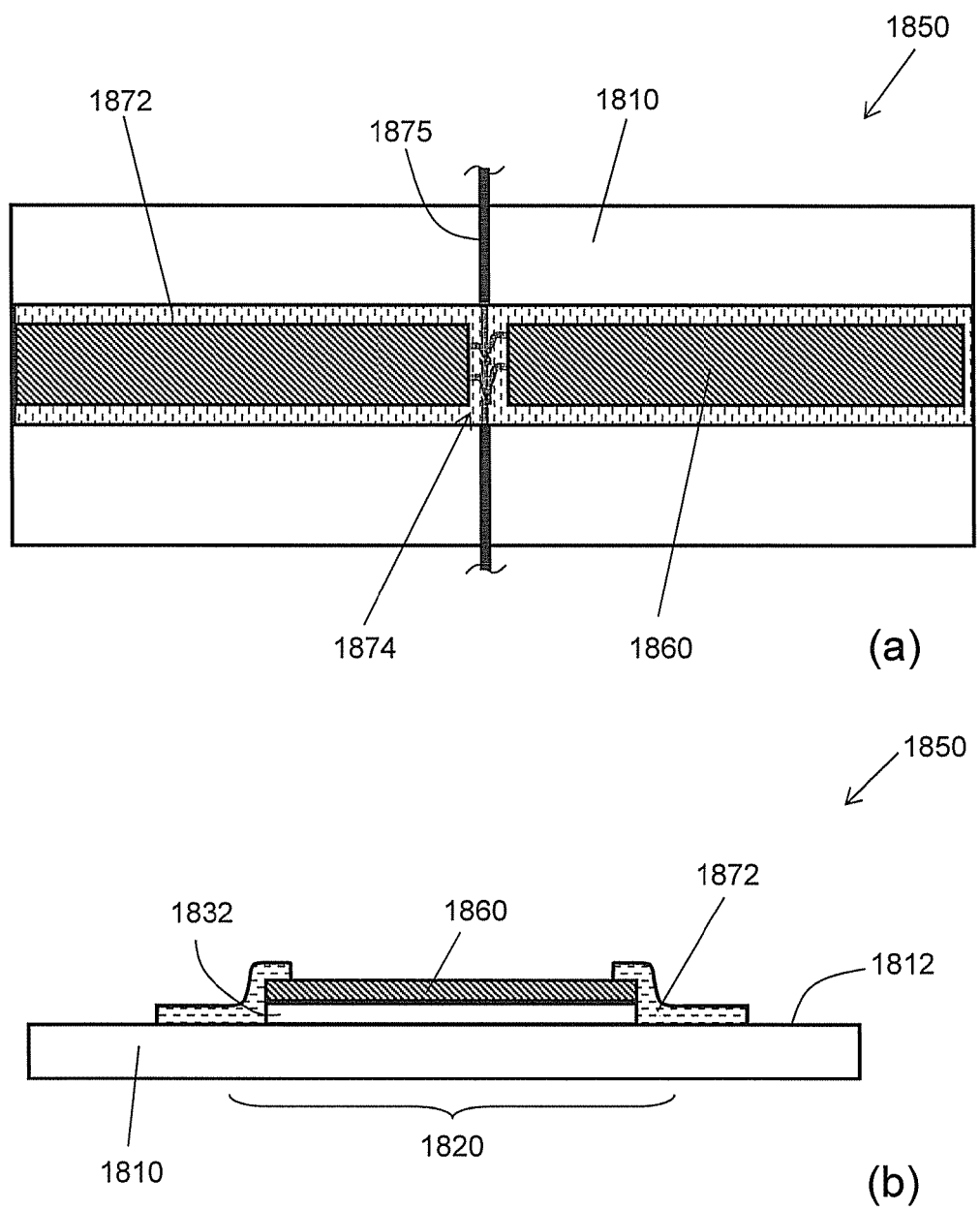
FIG. 18 is a schematic top view and in schematic cross-sectional view of a photovoltaic roofing or siding element according to one embodiment of the invention.

In certain embodiments, a cap layer is disposed on the rigid roofing or siding substrate. For example, as shown in schematic top view and in schematic cross-sectional view in FIG. 18, a cap layer can be disposed on the rigid roofing or siding substrate to cover areas of the receptor zone in which a photovoltaic element is not disposed. In the photovoltaic roofing or siding element 1850 of FIG. 18, rigid roofing or siding substrate 1810 has a receptor zone 1820 on its top surface 1812. Affixed to in the receptor zone (through adhesive layer 1832), but not covering it completely, are two photovoltaic elements 1860. Cap layer 1872 is disposed on top surface 1812 of rigid roofing or siding substrate 1810 to cover areas of the receptor zone 1820 in which a photovoltaic element 1860 is not disposed. As shown in FIG. 18, a cap layer can also cover electrical connections (e.g., electrical connections 1874 to electrical cable 1875), thereby protecting them from the elements. Notably, a cap layer can cover electrical connections and/or wiring systems even when it is not used to cover exposed areas of a receptor zone. In other embodiments, a cap layer can seal the edges of a joint between the photovoltaic element(s) and the rigid roofing or siding substrate, whether or not the photovoltaic element(s) cover the entire receptor zone. For example, as shown in FIG. 18, cap layer 1872 seals the joint between the rigid roofing or siding substrate 1812 and the photovoltaic elements 1860. The cap layer can be provided in individual pieces (e.g., tape-shaped strips), or as a single piece. For example, in certain embodiments, the cap layer can be provided as a single piece with cutout areas to expose the photovoltaically active areas of the photovoltaic elements. The cap layer can be provided, for example, as a polymer film (e.g., self-adhesive). The cap layer can alternatively be provided as a coating (e.g., a roof coating). Such coatings are known in the art, and can also provide other attributes to the roof or substantially vertical exterior surface of a building, such as reflectivity of solar radiation. Coatings can be formed, for example, from acrylic or fluorinated polymers, or latex-based materials. A cap layer can cover one or more photovoltaic roofing or siding elements.

Figure 19:
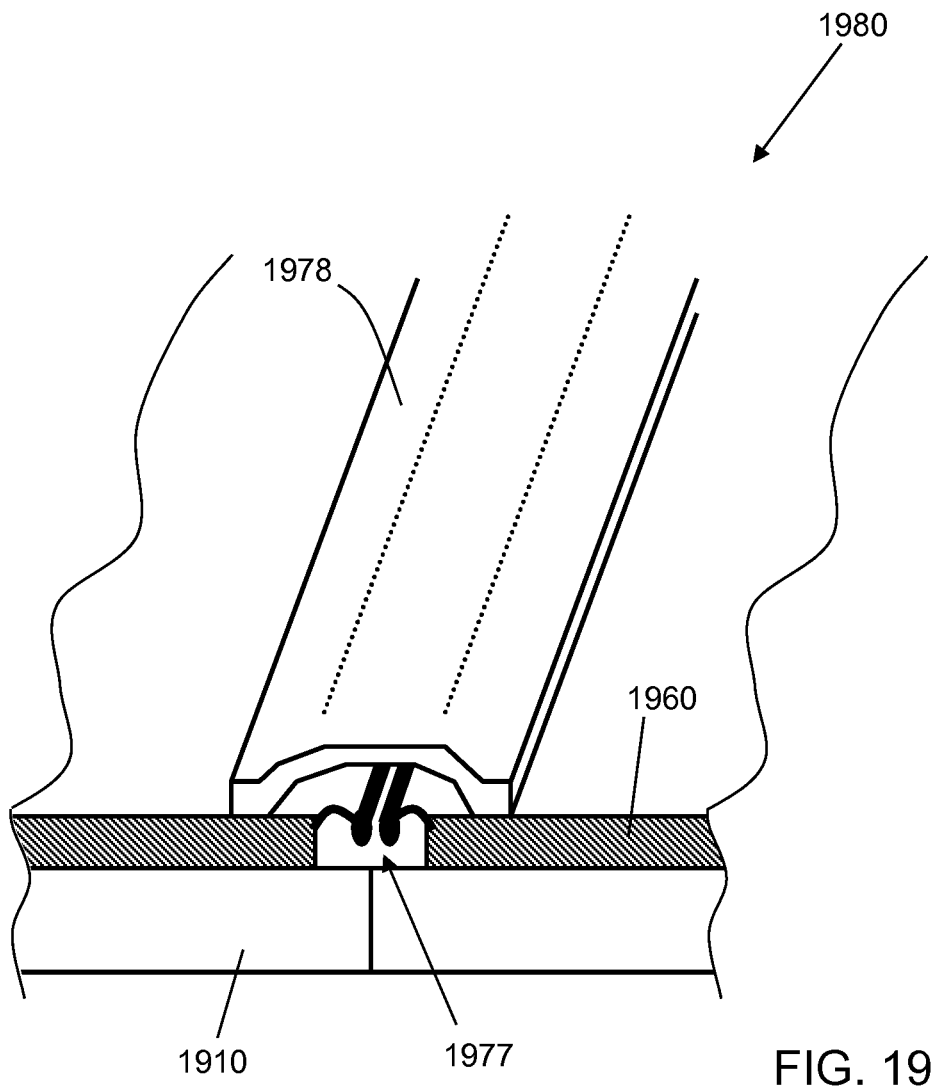
FIG. 19 is a partial schematic cross-sectional/perspective view of a photovoltaic roofing system according to one embodiment of the invention.

In certain embodiments, a protective conduit covers the wiring interconnecting the photovoltaic elements, thereby protecting it from the elements, for example as shown in FIG. 19. In the photovoltaic roofing system 1980 shown in partial schematic cross-sectional/perspective view FIG. 19, the conduit 1978 is at the junction of two adjacent roofing panels 1910, and covers wiring system 1977 that interconnects photovoltaic elements 1960. In other embodiments, the conduit can be disposed in the middle part of a panel (e.g., between the connectorized ends of the horizontally-arranged photovoltaic elements). Of course, a conduit can also be used with a tile-based photovoltaic roofing system or a photovoltaic siding system. The conduit can, for example, be similar in structure to a wire covering product such as is commonly used for covering wires or cables on floors in office environments. The conduit can take any of a number of other forms, such as round or rectangular tube. A cap layer (e.g., protective tape or cover sheet) comprising a suitable covering material can also be applied over a conduit so as to provide a desired aesthetic effect or weathering protection to the conduit. A cap layer can also or alternatively be disposed within the conduit to provide further protection.

Figure 20:
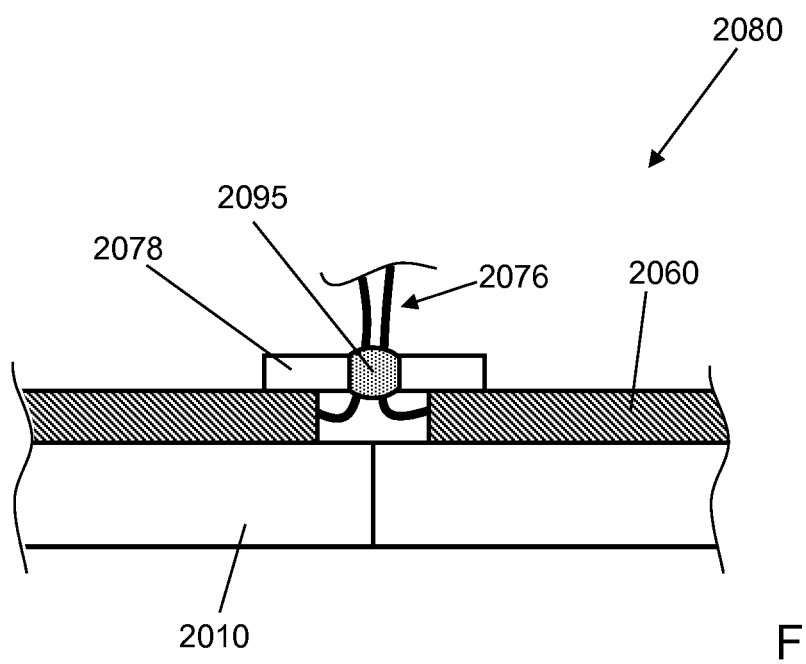
FIG. 20 is a partial schematic cross-sectional view of a photovoltaic roofing or siding system according to another embodiment of the invention.

In another embodiment, a protective covering is disposed over the electrical connections. As shown in partial schematic cross-sectional view in FIG. 20, the protective covering can have holes formed therein near the electrical connections of the photovoltaic elements, so that wires for connection to an electrical system can pass through the holes to a wiring system for collection of the power generated by the photovoltaic elements. In the photovoltaic roofing system 2080 of FIG. 20, the protective cover 2078 covers cables 2076 that interconnects photovoltaic elements 2060 (disposed on roofing panels 2010) into a wiring system. The holes can be sealed with an appropriate adhesive or sealant, such as a butyl, a mastic, or a neoprene adhesive (2095). The wiring system can be provided in a conduit, which can be mounted within the roofing system and covered by a conventional roofing material strip or tape. Alternatively, the conduit can be mounted above the surface of the roof in the vicinity of the electrical connections of the photovoltaic elements. For example, a conduit could be provided as a tube of any desired geometry) supported on legs which have pitch pockets filled with tar, adhesive, caulk, or the like to accommodate dimensional changes or vibrational effects experienced during use, this minimizing transfer of forces to the wiring system.

In other embodiments, individual photovoltaic elements are electrically interconnected in series, with sets of series-connected photovoltaic elements being connected to a wiring system or a bus system (e.g., within a conduit) along one or more edges of a roof section. Electrical connections are described in more detail, for example, in U.S. patent application Ser. Nos. 11/743,073 and 12/266,498, each of which is incorporated herein by reference in its entirety.

The photovoltaic roofing elements of the present invention can have other features. For example, additional surfacing media such as silica granules or polymer granules with high transmittance to solar radiation can be disposed on the top surface of the photovoltaic element to provide a textured surface or added aesthetic value, such as described in U.S. patent application Ser. No. 11/742,909, which is hereby incorporated herein by reference in its entirety. The photovoltaic roofing elements can also include a colored and/or patterned layer, for example to tune the appearance and/or to provide a masking effect to the photovoltaic element. The colors and/or patterns can be created using, for example, optical interference, stacks of dielectric layers, special bandwidth-transmissive pigments, nanometallic particles (e.g., Cermet Film available from Saint-Gobain Corp.), or quantum dot technology. Colored and/or patterned layers are described, for example, in U.S. patent application Ser. No. 12/145,166, which is hereby incorporated herein by reference in its entirety. The photovoltaic roofing element can also include a layer disposed on the roofing substrate that will reflect unwanted near-IR radiation of the solar spectrum, thereby allowing the photovoltaic element to operate at a lower temperature (and therefore more efficiently). IR-reflective materials are described, for example, in U.S. patent application Ser. No. 12/266,481, as well as in U.S. patent application Ser. Nos. 60/985,940, 60/985,943, and 60/986,221, each of which is hereby incorporated herein by reference in its entirety.

Photovoltaic roofing elements of the present invention can be fabricated using many techniques familiar to the skilled artisan. Roofing substrates can be made using a variety of techniques. When the roofing substrate is a polymeric tile, shake or panel, the person of skill in the art can use methods such as those described in U.S. patent application Ser. No. 12/146,986, which is hereby incorporated herein by reference.

In certain embodiments, the present invention may also be practiced using techniques described in U.S. Patent Application Publication nos. 2005/0072456 and 2004/0144043, and in U.S. Pat. No. 4,860,509, each of which is hereby incorporated herein by reference in its entirety.

Another aspect of the invention is a method for installing a photovoltaic roofing system on a roof deck. First, one or more rigid roofing substrates as described above are installed on a roof deck. Then, one or more photovoltaic elements are disposed in the one or more receptor zones of the top surfaces of the rigid roofing substrates. The rigid roofing substrates can be installed robustly in a rugged manner to cover the roof; this step can be performed by a roofing professional, who need not have any particular expertise with respect to photovoltaic systems. The one or more photovoltaic elements can then be disposed in the receptor zones as described above. For example, when the photovoltaic element, the rigid roofing substrate, or both have releasable liners covering an adhesive material, the releasable liner can be removed, and the photovoltaic elements affixed to the rigid roofing substrate. In certain embodiments, one or more cap layers as described above are disposed on the rigid roofing substrates after the photovoltaic elements are disposed thereon.

The rigid roofing products can be applied to the roof deck in bottom-up manner (i.e., from the lower edge of the roof to the upper edge), as is conventional. The photovoltaic elements can then be installed, for example, from the top of roof to the bottom. Top-down installation can allow the more fragile and potentially slippery photovoltaic elements to be applied in a more gentle manner, and without the need for an installer to walk on already-installed photovoltaic elements. Of course, the photovoltaic elements can be installed in any other convenient order.

Another aspect of the invention is a method for installing a photovoltaic siding system. First, one or more rigid siding substrates as described above are installed on a substantially vertical exterior surface of a building. Then, one or more photovoltaic elements are disposed in the one or more receptor zones of the top surfaces of the rigid siding substrates. The rigid siding substrates can be installed robustly in a rugged manner to cover the substantially vertical exterior surface of a building; this step can be performed by a siding professional, who need not have any particular expertise with respect to photovoltaic systems. The one or more photovoltaic elements can then be disposed in the receptor zones as described above. For example, when the photovoltaic element, the rigid siding substrate, or both have releasable liners covering an adhesive material, the releasable liner can be removed, and the photovoltaic elements affixed to the rigid siding substrate. In certain embodiments, one or more cap layers as described above are disposed on the rigid siding substrates after the photovoltaic elements are disposed thereon.

Another benefit derived in certain embodiments of the invention is that when photovoltaic elements are separately installed on a roof or a substantially vertical exterior surface of a building, it is possible to test the performance of the photovoltaic elements before they are disposed on the receptor zones. Such testing can be performed, for example, immediately prior to attachment, so that any faulty photovoltaic elements are discovered before they are attached to the rigid roofing or siding substrate.

Of course, in other embodiments, the photovoltaic elements are disposed on the rigid roofing or siding substrates before they are installed. For example, the photovoltaic elements can be disposed on the rigid roofing or siding substrates at the worksite, but before installation. This can allow the individual materials to be transported more efficiently, and be put together to fit the particular dimensions of the roof. In other embodiments, the photovoltaic elements can be disposed on the rigid roofing or siding substrates in a factory setting. In such embodiments, the use of a rigid roofing or siding substrate with a receptor zone can increase adhesion of the photovoltaic roofing element without sacrificing properties of the rest of the roofing or siding product, and can increase process flexibility during manufacture.

In certain embodiments, the photovoltaic elements are provided with removable cover elements covering their photovoltaically-active areas, as described in U.S. patent application Ser. No. 12/145,166, which is hereby incorporated herein by reference in its entirety. The removable cover elements can be removed after installation to expose the photovoltaically active areas. Moreover, in embodiments in which a coating (e.g., a solar reflective coating) is used as described above, the removable cover elements can be removed after the coating is applied. In such embodiments, the roofing coating can be applied over the entire roof, and can help to waterproof the seams between the photovoltaic elements and the rigid roofing or siding substrates.

Another aspect of the invention is a kit for the installation of a photovoltaic roofing or system, the kit comprising one or more rigid roofing or siding substrates as described above; and one or more photovoltaic elements. The one or more photovoltaic elements can be selected to be compatible, both in size and in adhesive characteristics as described above, with the rigid roofing or siding substrates.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. A method for installing a photovoltaic roofing or siding system on a building, the method comprising:
    installing on the building a plurality of rigid roofing or siding substrates, each rigid roofing or siding substrate having a top surface, the top surface having one or more receptor zones and one or more areas adjacent the one or more receptor zones, each receptor zone having a different surfacing than the area of the top surface adjacent to it, and wherein no photovoltaic element is affixed in the one or more receptor zones; then
    disposing one or more photovoltaic elements on the one or more receptor zones of the top surface of each rigid roofing or siding substrate,
wherein each receptor zone of each rigid roofing or siding substrate is defined by an uncoated of mer material having a releasable liner disposed thereon and being adapted to receive one or more of the photovoltaic elements on the uncoated polymer material, and wherein the method includes, for each of the receptor zones, removing the releasable liner after installing each rigid roofing or siding substrate on the building and before disposing the one or more photovoltaic elements on the receptor zone.

2. The method according to claim 1, wherein in each of the one or more rigid roofing or siding substrates, each receptor zone is adapted to receive one or more encapsulated photovoltaic elements on the uncoated polymer material.

3. The method according to claim 1, wherein in each of the one or more rigid roofing or siding substrates, the uncoated polymer material of the one or more receptor zones has a $\Delta E^* < 20$ compared to the top surface of the rigid roofing or siding substrate in an area adjacent to the receptor zone.

4. The method according to claim 1, wherein in each of the one or more rigid roofing or siding substrates, the uncoated polymer material of the one or more receptor zones has a $\Delta E^* < 20$ compared to the photovoltaically active surface of the photovoltaic element with which the roofing substrate is to be used.

5. The method according to claim 1, wherein in each of the one or more rigid roofing or siding substrates, the uncoated polymer material of the receptor zone is stabilized to UV radiation.

6. The method according to claim 1, wherein in each of the one or more rigid roofing or siding substrates, the uncoated polymer material is textured.

7. The method according to claim 1, wherein in each of the one or more rigid roofing or siding substrates, the top surface of the rigid roofing or siding substrate in the receptor zone is recessed from the top surface of the rigid roofing or siding substrate in the area adjacent to the receptor zone.

8. The method according to claim 1, wherein each receptor zone of each rigid roofing or siding substrate is defined by having a different surface material than the surface of the one or more areas adjacent the one or more receptor zones, having a different surface texture than the surface of the one or more areas adjacent the one or more receptor zones, or by being recessed from the surface of the one or more areas adjacent the one or more receptor zones.

9. The method according to claim 8, wherein in each rigid roofing or siding substrate, each receptor zone is defined by having a different surface material than the surface of the one or more areas adjacent the one or more receptor zones.

10. The method according to claim 8, wherein in each rigid roofing or siding substrate, each receptor zone is defined by having a different surface texture than the surface of the one or more areas adjacent the one or more receptor zones.

11. A method for installing a photovoltaic roofing or siding system on a building, the method comprising:
    installing on the building a plurality of rigid siding substrate having a top surface, the top surface having one or more receptor zones and one or more areas adjacent the one or more receptor zones, each receptor zone having a different surfacing than the area of the top surface adjacent to it, and wherein no photovoltaic element is affixed in the one or more receptor zones; then
    disposing one or more photovoltaic elements on the one or more receptor zones of the top surface of each rigid roofing substrate,
wherein in each rigid roofing or siding substrate, each receptor zone is defined by being recessed from the surface of the one or more areas adjacent the one or more receptor zones.

12. The method according to claim 1, wherein the surfacing of the one or more receptor zones or the top surface of each rigid roofing or siding substrate in the area adjacent the one or more receptor zones includes one or more alignment marks.

13. The method according to claim 1, wherein each photovoltaic element includes a fastening zone or one or more fastening tabs.

14. The method according to claim 1, wherein each receptor zone is adapted to receive more than one photovoltaic element.

15. The method according to claim 1, wherein each photovoltaic element is adapted to be received by more than one receptor zone.

16. A method for installing a photovoltaic roofing or siding system on a building, the method comprising:
    installing on the building a plurality of rigid roofing or siding substrates, each rigid roofing or siding substrate having a top surface, the top surface having one or more receptor zones and one or more areas adjacent the one or more receptor zones, each receptor zone having a different surfacing than the area of the top surface adjacent to it, and wherein no photovoltaic element is affixed in the one or more receptor zones; then
    disposing one or more photovoltaic elements on the one or more receptor zones of the top surface of each rigid roofing substrate,
wherein each rigid roofing or siding substrate is a rigid roofing substrate, and wherein the plurality of rigid roofing substrates are installed on the roof of the building, and wherein the photovoltaic elements include removable cover elements, and wherein the method further comprises, after disposing the photovoltaic elements on the roofing substrates, applying a roofing coating, then removing the removable cover elements from the photovoltaic elements.

17. The method according to claim 16, wherein the rigid roofing substrates are installed in a bottom-up fashion, and the photovoltaic elements are installed in a top-down fashion.

18. A method for installing a photovoltaic siding system on a building, the method comprising:
    installing on a substantially vertical exterior surface of the building a plurality of rigid roofing or siding substrates, each rigid roofing or siding substrate having a top surface, the top surface having one or more receptor zones and one or more areas adjacent the one or more receptor zones, each receptor zone having a different surfacing than the area of the top surface adjacent to it, and wherein no photovoltaic element is affixed in the one or more receptor zones; then disposing one or more photovoltaic elements on the one or more receptor zones of the top surface of each rigid siding substrate.

19. The method according to claim 11, wherein for each rigid roofing or siding substrate, the one or more photovoltaic elements are disposed in the one or more receptor zones, such that the top surface of each of the one or more photovoltaic elements is substantially flush with the top surface of the area of the rigid roofing or siding substrate adjacent to the receptor zone.

20. The method according to claim 11, wherein each receptor zone of each rigid roofing or siding substrate is defined by an uncoated polymer material having a releasable liner disposed thereon and being adapted to receive one or more of the photovoltaic elements on the uncoated polymer material, and wherein the method includes, for each of the receptor zones, removing the releasable liner after installing each rigid roofing or siding substrate on the building and before disposing the one or more photovoltaic elements on the receptor zone.

* * * * *